(12) United States Patent
Iwai et al.

(10) Patent No.: US 7,710,779 B2
(45) Date of Patent: May 4, 2010

(54) NONVOLATILE SEMICONDUCTOR MEMORY, METHOD FOR READING OUT THEREOF, AND MEMORY CARD

(75) Inventors: Makoto Iwai, Yokohama (JP); Yoshihisa Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/361,362

(22) Filed: Jan. 28, 2009

(65) Prior Publication Data

US 2009/0154241 A1    Jun. 18, 2009

Related U.S. Application Data

(62) Division of application No. 11/558,714, filed on Nov. 10, 2006, now Pat. No. 7,529,131.

(30) Foreign Application Priority Data

Nov. 11, 2005 (JP) ............................ 2005-327725
Dec. 7, 2005 (JP) ............................ 2005-354034

(51) Int. Cl.
 *G11C 16/04* (2006.01)
(52) U.S. Cl. ............................ 365/185.17; 365/185.18
(58) Field of Classification Search ............ 365/185.17, 365/185.18
 See application file for complete search history.

(56) References Cited

U.S. PATENT DOCUMENTS 5,761,125 A    6/1998    Himeno

| 7,251,160 | B2 | 7/2007 | Li et al. |
|---|---|---|---|
| 7,352,625 | B2 | 4/2008 | Futatsuyama et al. |
| 2002/0050607 | A1 | 5/2002 | Nakamura et al. |
| 2002/0159315 | A1 | 10/2002 | Noguchi et al. |
| 2004/0012437 | A1 | 1/2004 | Kwon et al. |
| 2005/0105334 | A1 | 5/2005 | Futatsuyama |
| 2006/0072359 | A1 | 4/2006 | Futatsuyama et al. |
| 2007/0166918 | A1* | 7/2007 | Oh et al. .................... 438/257 |

(Continued)

FOREIGN PATENT DOCUMENTS

JP    08-055488    2/1996

(Continued)

OTHER PUBLICATIONS

Ken Takeuchi, et al., ISSCC Digest Technical Papers, vol. 49 ISSN 0193-6530, Feb. 2006, pp. 144-145.

*Primary Examiner*—Hoai V Ho
(74) *Attorney, Agent, or Firm*—Oblon, Spivak, McClelland, Maier & Neustadt, L.L.P.

(57) ABSTRACT

A nonvolatile semiconductor memory includes: a memory cell unit including a plurality of memory cells having an electric charge accumulation layer and a control electrode, said memory cells being electrically connected in series; a plurality of word lines, each of which is electrically connected to said control electrode of said plurality of memory cells; a source line electrically connected to said memory cells at one end of said memory cell unit; a bit line electrically connected to said memory cells at the other end of said memory cell unit; and a control signal generation circuit, which during a data readout operation staggers a timing for selecting the word line connected to said memory cells of said memory cell unit from a timing for selecting a non-selected word line connected to a non-selected memory.

5 Claims, 22 Drawing Sheets

U.S. PATENT DOCUMENTS

2008/0049508 A1  2/2008  Iwai et al.
2008/0049509 A1  2/2008  Iwai

FOREIGN PATENT DOCUMENTS

| | | |
|---|---|---|
| JP | 2000-173300 | 6/2000 |
| JP | 2001-084786 | 3/2001 |
| JP | 2002-133885 | 5/2002 |
| JP | 2002-358792 | 12/2002 |
| JP | 2004-055108 | 2/2004 |
| JP | 2005-108404 | 4/2005 |
| JP | 2006-107577 | 4/2006 |

* cited by examiner

NONVOLATILE SEMICONDUCTOR MEMORY, METHOD FOR READING OUT THEREOF, AND MEMORY CARD

CROSS-REFERENCE TO RELATED APPLICATIONS

This application is a division of and claims the benefit of priority under 35 U.S.C. §120 from U.S. Ser. No. 11/558,714 filed Nov. 10, 2006, which issued as U.S. Pat. No. 7,529,131, and claims the benefit of priority under 35 U.S.C. §119 from Japanese Patent Application No. 2005-327725 filed on Nov. 11, 2005, and No. 2005-354034 filed on Dec. 7, 2005, the entire contents of each of which are incorporated herein by reference.

BACKGROUND OF THE INVENTION

1. Field of the Invention

This invention relates to a nonvolatile semiconductor memory, a method for data readout thereof, and a memory card, and in particular relates to an electrically erasable type nonvolatile semiconductor memory, a method for reading out data and a memory card in which an electrically erasable type nonvolatile semiconductor memory is mounted.

2. Description of the Related Art

In recent years, among semiconductor memories, a nonvolatile semiconductor memory in which the programmed data are in a nonvolatile way held is diffused. In the nonvolatile semiconductor memory, electrically erasable type nonvolatile semiconductor memory having a NAND type memory cell array (hereinafter will be simply called as a NAND type nonvolatile semiconductor memory) is suitable for enlarging storage capacity.

In a memory cell array of the NAND type nonvolatile semiconductor memory, a plurality of memory cell units are disposed in a matrix shape. One memory cell of the memory cell units is constituted by an electric filed effect transistor. The electric filed effect transistor having an electric charge accumulation layer, a control electrode, a source region and a drain region. This electric charge accumulation layer is electrically floating. The memory cell unit provides with a plurality of memory cells that is electrically connected in series, a drain side selection transistor that is connected to a drain region of one end of the plurality of memory cells, and a source side selection transistor that is connected to a source region of the other side of the plurality of the memory cells.

In the memory cell units, the source region and the drain region of the memory cells that are mutually adjacent are shared. In the respective control electrodes of the plurality of memory cells, word lines, in which the memory cell array is extended, are electrically connected. Further, in a drain region of one end of memory cell of the memory cell units, a bit line is connected via a drain side selection transistor. In a gate electrode of the drain side selection transistor, a drain side gate line is connected. In a source region of the other side of memory cell of the memory cell units, a source line is connected via a source side selection transistor. In a gate electrode of the source side selection transistor, a source side selected gate line is connected. In the NAND type nonvolatile semiconductor memory, a decoder, a data programming circuit, a data readout circuit and so forth are disposed.

In a data programming operation of the NAND type nonvolatile semiconductor memory, data may be programmed in a selected memory cell by applying an appropriate program voltage, a control voltage and so forth, to each of: a being selected word line, a selected bit line, a selected source line, a selected drain side selected gate line, and a selected source side selected gate line. On the other hand, data is not programmed in non selected memory cells by applying a non-program voltage, a control voltage and so forth, to a being non-selected word lines and so forth.

In addition to above, related art in respect to a data programming operation are disclosed in JP H08-55488 A, and JP 2000-173300 A, respectively.

Further, the data readout operation of the NAND type nonvolatile semiconductor memory are performed in the following procedure. Firstly, the voltage of the selected drain side selected gate line is boosted, for instance, to a degree of 4V so that the selected drain side selected transistor is made be in an on-state; subsequently, a voltage of about 1V is applied to the selected bit line; and a readout voltage is applied to the selected word line that is connected to the selected memory cell. On the other hand, the voltage of the non-selected word line that is connected to the non-selected memory cells other than the selected memory cell is boosted, for instance, to a degree of 5V so that the non-selected memory cells made be in an on-state. Afterwards, the voltage of the source side selected gate line is boosted, for instance, to a degree of 4V so that the source side selected gate transistor is made be in an on-state. Then, detecting the voltage change of the selected bit line generated by this result, whether "0" data or "1" data are stored in the selected memory cell.

In addition the related art in respect to a data readout operation is disclosed in JP 2005-108404 A.

BRIEF SUMMARY OF THE INVENTION

A first aspect of the embodiment of the invention relates to a nonvolatile semiconductor memory comprising: a memory cell unit including a plurality of memory cells having an electric charge accumulation layer and a control electrode, the memory cells being electrically connected in series; a plurality of word lines, each of which is electrically connected to the control electrode of the plurality of memory cells; a source line electrically connected to the memory cells at one end of the memory cell unit; a bit line electrically connected to the memory cells at the other end of the memory cell unit; and a control signal generation circuit, which during a data readout operation staggers a timing for selecting the word line connected to the memory cells of the memory cell unit from a timing for selecting a non-selected word line connected to a non-selected memory.

A second aspect of the embodiment relates to a method for reading data out of nonvolatile semiconductor memory including: a memory cell unit in which each memory cell has an electric charge accumulation layer and a control electrode electrically connected in series; a plurality of word lines, each of which is electrically connected to a control electrode of the plurality of memory cells; a bit line which is electrically connected to the memory cells at one end of the memory unit; and a source line electrically connected to the memory cells at the other end of the memory unit, the method comprising: selecting a non-volatile word line which is connected to a non-selected memory cell of the memory unit; delaying a selected word line which is connected to a selected memory cell of the memory unit for selection timing of the non-selected word line; and selecting the word line.

A third aspect of the embodiment relates to a memory card comprising: a nonvolatile semiconductor memory defined in the first aspect; a controller which controls an operation of the nonvolatile semiconductor memory; and a pad section connected to the nonvolatile semiconductor memory via said controller and which performs an input of control signal, an input of power and an input/output of data.

A fourth aspect of the embodiment relates to a nonvolatile semiconductor memory comprising: a memory cell unit in which a plurality of memory cells have an electric charge accumulation layer and a control electrode electrically connected; and a source side selection transistor is electrically connected to the memory cell of one end of the plurality of memory cells; and a drain side selection transistor is electrically connected to the other end of the plurality of memory cells; a plurality of word lines each of which is electrically connected to a control electrode of the plurality of memory cells; a source line which is electrically connected to the source side selection transistor; a bit line which is electrically connected to the drain side selection transistor; a gate line control circuit, in which on a data readout operation, the drain side selection transistor is operated after the operation of the source side selection transistor when a selected memory cell is adjacent to the source side selection transistor, and the source side selection transistor is operated after the operation of the drain side selection transistor when the selected memory cell is adjacent to the drain side selection transistor; and a control signal generation circuit in which on a data readout operation, the select voltage applied to a selected word line connected to a selected memory cell is changed depending on either when the selection memory cell is adjacent to the source side selection transistor or when the selection memory cell is to the drain side selection transistor.

A fifth aspect of the embodiment relates to a nonvolatile semiconductor memory comprising: a memory cell unit in which a plurality of memory cells have an electric charge accumulation layer and a control electrode electrically connected; and a source side selection transistor is electrically connected to the memory cell of one end of the plurality of memory cells; and a drain side selection transistor is electrically connected to the other end of the plurality of memory cells; a plurality of word lines each of which is electrically connected to a control electrode of the plurality of memory cells; a source line which is electrically connected to the source side selection transistor; a bit line which is electrically connected to the drain side selection transistor; a gate line control circuit, in which on a data readout operation, the drain side selection transistor is operated after the operation of the source side selection transistor when a selected memory cell is adjacent to the source side selection transistor, and the source side selection transistor is operated after the operation of the drain side selection transistor when the selected memory cell is adjacent to the drain side selection transistor; and a control signal generation circuit, which during a data readout operation staggers a timing for selecting the word line connected to the memory cells of the memory cell unit from a timing for selecting a non-selected word line connected to a non-selected memory, and in which on a data readout operation, the select voltage applied to a selected word line connected to a selected memory cell is changed depending on either when the selection memory cell is adjacent to the source side selection transistor or when the selection memory cell is to the drain side selection transistor.

DETAILED DESCRIPTION OF THE INVENTION

First Embodiment

This inventors and the like conducted an examination especially for a data readout operation of the NAND type nonvolatile semiconductor memory; as a result, they found a fact that improvement of operation function is prevented mainly by generation of 2 noises. To explain concretely, in the case voltage is applied to the selected word line that is connected to a control electrodes (a control gate electrode) of the selected memory cell, one noise is caused by undershoot in which electric charge is flown to a side of select voltage generation circuit that is connected to the selected word line in the external section of memory cell array. The other noise is caused by an overshoot based on coupling noise that is occurred in the select voltage of the selected word line when voltage of the non-selected word lines is boosted in the readout voltage (a non-select voltage). These noises are not only induce an error operation in the readout operation and program operation of the NAND type nonvolatile semiconductor memory, but also lead to increase of readout operation time and program operation time.

This inventors and the like eagerly conducted an examination based on such point of view. Then, in the data readout operation of the NAND type nonvolatile semiconductor memory, the inventors and the like came up with the idea that, timing of the above-mentioned occurrence of two noises may be shifted by shifting timing applying the readout voltage of data stored in the memory cells for the timing applying the select voltage of the memory cells of memory cell unit, which in turn may reduce effect of the noises. As a consequence, the present invention is completed.

The following will be explained on a first embodiment of the present invention referring to the accompanying drawings. However, the present invention can be conducted in a much variety of aspects other than the first embodiment that will be explained from now on thus, the present invention is not limited to the first embodiment. In addition, in the first embodiment and a second embodiment described later, same symbols are referred to a part having the same or similar function to skip the repeated explanation.

[A System Configuration of the NAND Type Nonvolatile Semiconductor Memory]

Figure 1:
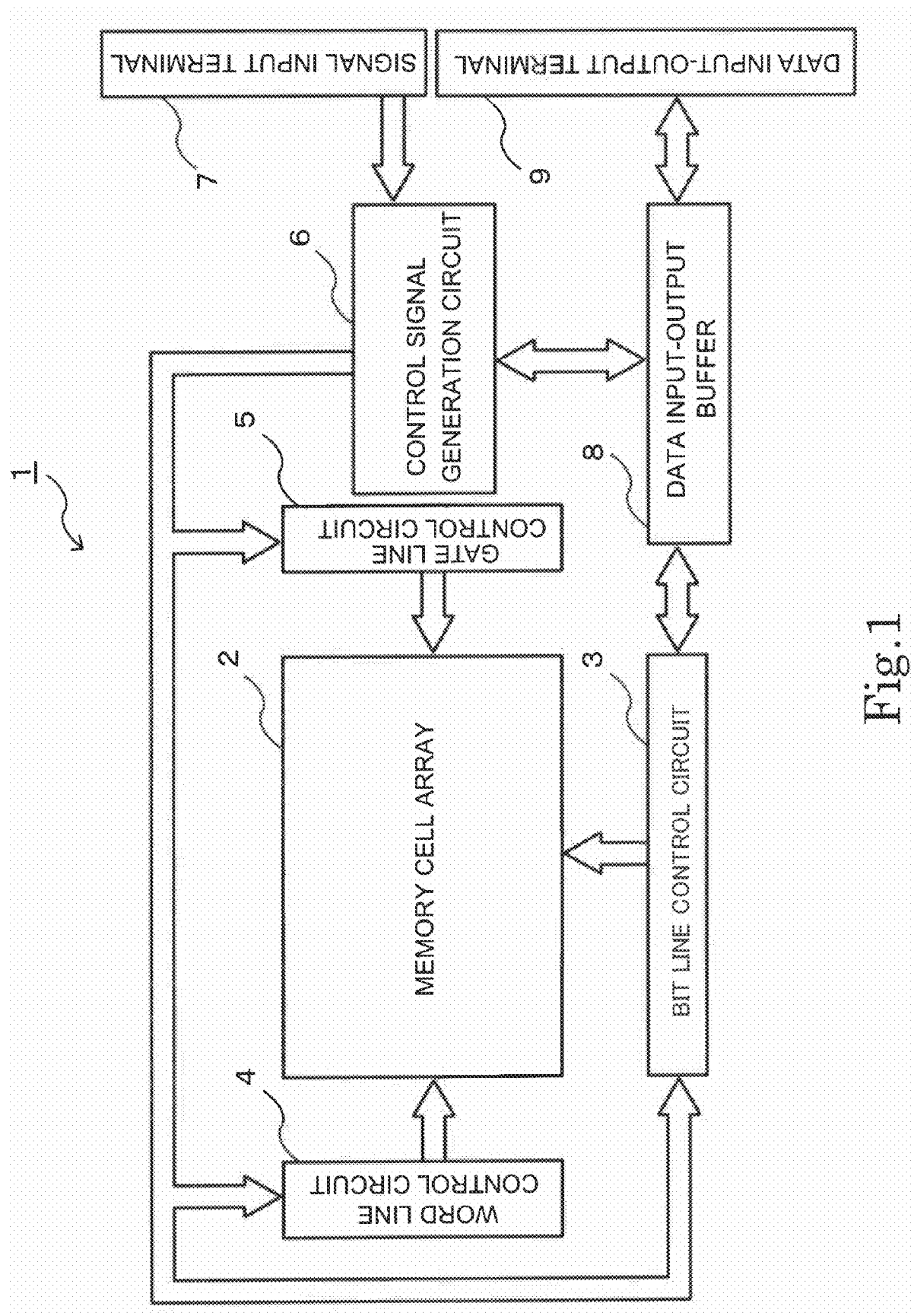
FIG. 1 is a functional block diagram of the nonvolatile semiconductor memory according to a first embodiment of the present invention.

As shown in FIG. 1, the NAND type nonvolatile semiconductor memory 1 is provided with: a memory cell array 2, a bit line control circuit 3; a word line control circuit 4; a gate line control circuit 5; a control signal generation circuit 5; a control signal generation circuit 6; a data input-output buffer 8; a signal input terminal 7; and a data input-output terminal 9. The memory cell array 2 is provided with: a plurality of selected gate lines; a plurality of word lines arranged among the plurality of gate lines; a plurality of source lines; a plurality of bit lines arranged crossing a plurality of word lines, a plurality of selected word lines and a plurality of source lines; and a plurality of memory cells arranged in a matrix shape. The bit line control circuit 3 controls a bit line arranged in the memory cell array 2. The word line control circuit 4 controls a word line arranged in the memory cell array 2. The gate line control circuit 5 controls the selected gate lines arranged in a memory cell array 2. The control signal generation circuit 6 generates each of the control signals of such as the word lines control circuit 3, the bit line control circuit 4 and the gate line control circuit 5, and so forth. The control signal generation circuit 6 is connected to the signal input terminal 7, in which a signal that will become a base for generation of the control signals. The data input-output buffer 8 is connected to the bit line control circuit 3, and the data input-output terminal 9 is connected to the data input-output buffer 8. In addition, in the first embodiment and the second embodiment described later, either of the bit line control circuit 3, the word line control circuit 4, the gate line control circuit 6, the control signal generation circuit 6 and the data input-output buffer 8 are arranged around the memory cell array 2; thus, they are simply defined "a peripheral circuit section".

Figure 2:
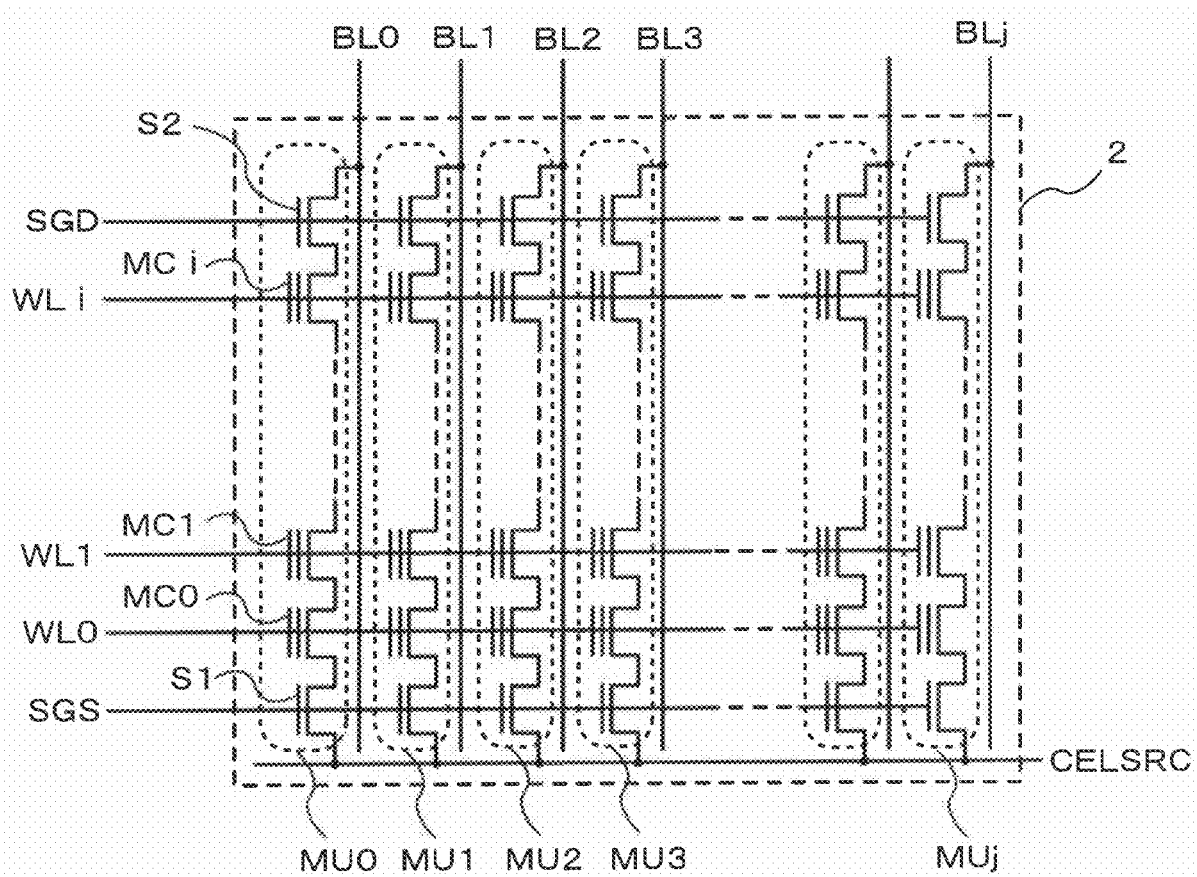
FIG. 2 is a circuit diagram of memory cell array of the nonvolatile semiconductor memory according to the first embodiment.

The memory cell array 2, as shown in FIG. 2, is configured arranging in parallel a plurality of memory cell units MU0, MU1, ..., MUj. Here, only a part of the memory cell units is shown. However, in fact, the memory cell units MU0 to MUj are further arranged in a matrix shape. Either of the memory cell units MU0 to MUj provide a plurality of memory cells MC0, MC1, ..., MCi. The connectivity number of the memory cells MC is set based on, for instance, 8, 16, 32, ... of byte configuration. One memory cell MC at least provides an electric charge accumulation layer (a floating gate electrode in the first embodiment), a control electrode (a control gate electrode), and the source region and drain region. In the plurality of memory cells MC0 to MCi, a source region of one memory cell and a drain region of the other memory, which are adjacent to each other, are configured to a unification so that the both regions are shared. In addition, either of the memory cell units MU0 to MUj are configured providing with a plurality of memory cells MC0 to MCi electrically connected in series in this way, a source side selection transistor S1 in which the drain region is electrically connected to one end (source side) of the memory cell MC0, the drain side selection transistor 2 in which the source region is connected to other end (drain side) of memory cell MCi.

In each of the control electrodes of the memory cells MC0, MC1, ..., MCi, word line WL0, WL1, ..., WLi are connected respectively. The word line WL0 is connected to the memory cells MC0 arranged on the same position of each of the memory cell units MU0 to MUj; the word line WL1 is connected into the memory cell MCI arranged on the same position, and follows as the same. To the gate electrode of each of the source side selection transistor S1 of the memory cell units MU0 to MUj, a source side selected gate line SGS is connected that is common to the memory cell array 2. Similarly, to the gate electrode of the drain side selection transistor S2, a drain side selection gate line SGD is connected that is common to the memory cell array 2. Further, to the source region of each of the source side selection transistor S1 of the memory cell units MU0 to MUj, cell source line CELSRC is connected that is common to the memory cell array 2. To the drain region of the drain side selection transistor S2, bit lines BL0, BL1, ..., BLi are connected respectively.

Figure 3:
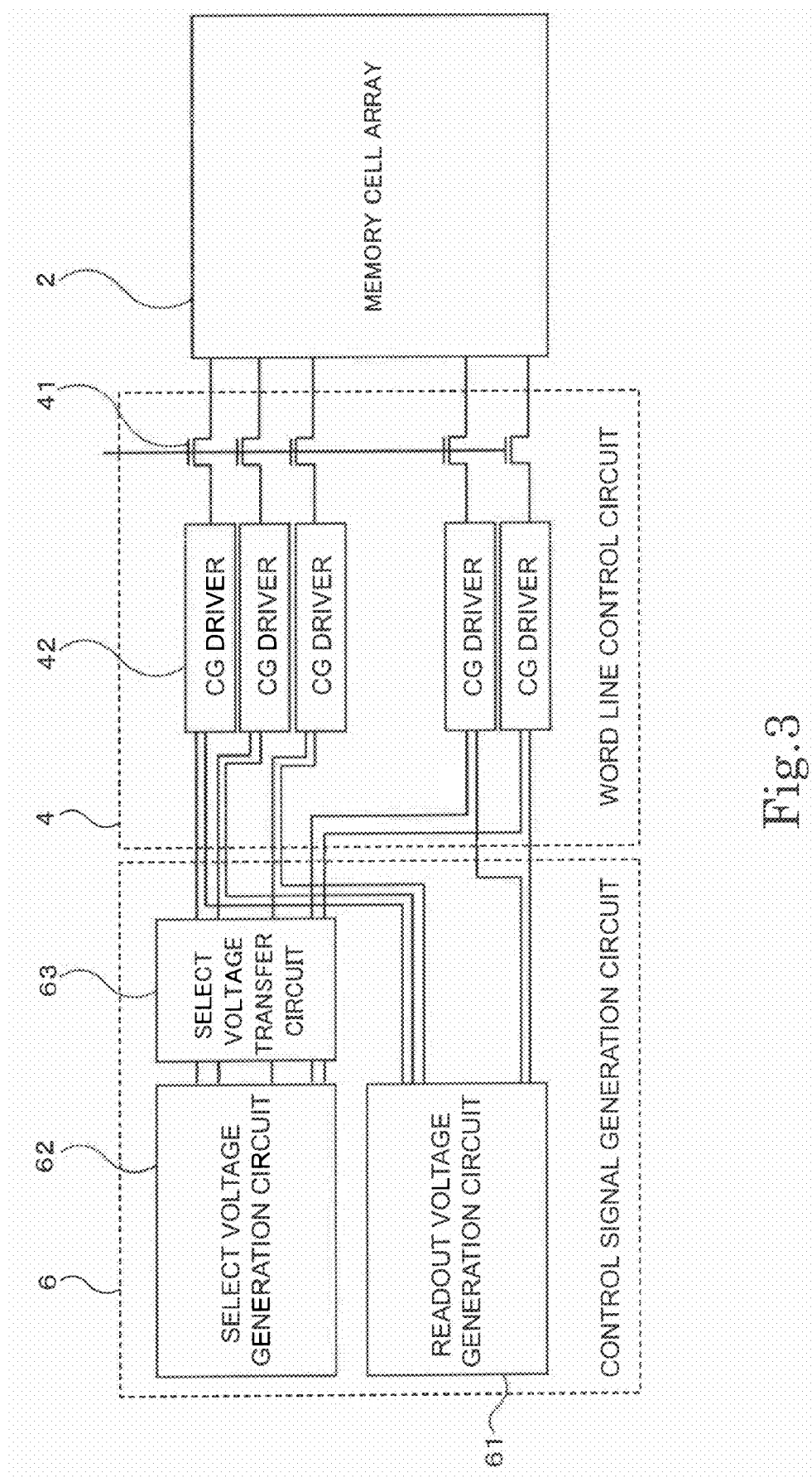
FIG. 3 is a functional block diagram showing the memory cell array and the detailed word line control circuit and a control signal generation circuit in the nonvolatile semiconductor memory according to the first embodiment.

The control signal generation circuit 6 of the peripheral circuit section, as shown in FIG. 3, the readout voltage generation circuit 61 in which the readout voltage Vread is generated, the select voltage generation circuit 62 in which the select voltage Vcgrv is generated, and the select voltage transfer circuit 63 in which what kind of voltage is given to the selected word line WL is decided, are at least provided. On the other hand, as shown in FIG. 3, the word line control circuit 4 is provided with a plurality of voltage transmit transistors 41 that are connected to each of the one ends of a plurality of word lines WL arranged in the memory cell array 2, and a plurality of control gate drivers (hereinafter will be simply called as "CG driver".) 42 that are respectively connected to the plurality of the voltage transmit transistors 41. Each of the CG drivers 42 are connected to the readout voltage generation circuit 61 and the select voltage generation circuit 62. In the control signal generation circuit 6 and the word line control circuit 4, the memory cell connected to the word line WL may be selected either "a readout voltage Vread" or "a selected voltage Vcgrv" depending on "selected" or "non-selected". Each of the gate electrodes of the plurality of voltage transmit transistors 41 is connected to a common gate line. When voltage more than the predetermined value (select voltage) is applied, the plurality of voltage transmit transistor 41 becomes in an on-state all at once, and thus the select voltages are applied to each of the plurality of word lines WL from the plurality of CG driver 42.

In the select voltage transfer circuit 63 of the control signal generation circuit 6, timing for applying the select voltage to the word line (the CG driver 42 in the actual practice) may be controlled. The concrete operation method will be explained later. The select voltage transfer circuit 63 transmits the program voltage into the selected word lines WL via the CG drivers 42 on the program operation, together with being used on the readout operation.

[Data Readout Operation]

Figure 4:
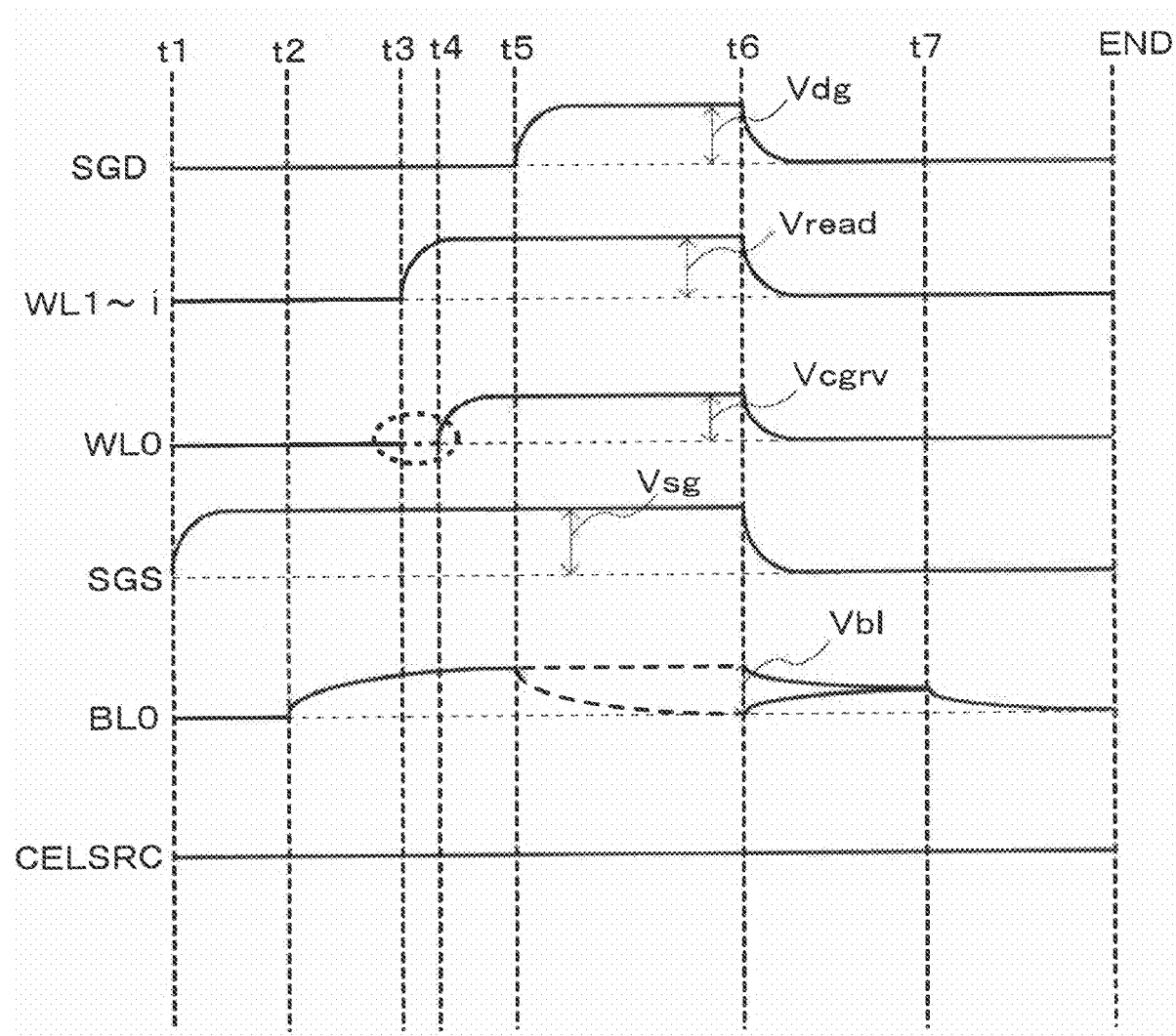
FIG. 4 is a timing chart of readout operation of the nonvolatile semiconductor memory according to the first embodiment.

Next, data readout operation of the above mentioned NAND type semiconductor memory 1 will be explained using FIG. 4. The timing chart shown in FIG. 4 is a timing chart in which the memory cell MC0 adjacent to the source side selection transistor S1 in the memory cell unit MU0 shown in FIG. 2 is considered as the selected memory cell and in which the data stored in the memory cell MC0 is read. The memory cells other than the memory cells MC1 to MCi are non-selected memory cells.

The data readout operation of the NAND type nonvolatile semiconductor memory 1 according to the first embodiment, at first at a time t1, applies a voltage Vsg to the source side selected gate line SGS, and thus the source side selection transistor S1 is made become in an on-state. Next at a time t2, a voltage Vb1 is applied to a bit line BL0. Then, at a time t3, readout voltage (non-select voltage) Vread is applied to the non-selected word lines WL1 to WLi that are connected to the non-selected memory cells MC1 to MCi other than the selected memory cell MC0. Afterwards, at a time t4, the select voltage Vcgrv that is boosting voltage to the word line WL0 connected to the selected memory cell MC0, is applied.

And afterwards, at a time t5, a voltage Vsg is applied to the drain side gate line SGD, and thus the drain side selection transistor S2 is made become in an on-state. By the series of operation, the drain side selection transistor S2, the source side selection transistor S1 and the non-selected memory cell MC0 become in an on-state, so that a voltage change occurs to the selected bit line BL0 depending on whether data "0" is stored or data "1" is stored in the selected memory cell MC0. At a time t6, data "1" or data "0" may be read out by judging the voltage change of the selected bit line BL0.

Here in addition, the timing chart will be explained considering the memory cell MC0 adjacent to the source side selection transistor S1 as the selected memory cell. However, the first embodiment does not limit the position of selected memory cell of the memory cell unit MU0 because influence of coupling noise between the selected word line WL and the non-selected word line WL adjacent to the selected word line WL are reduced.

[Advantages of Data Readout]

The NAND type semiconductor memory 1 according to the first embodiment performs a control in the data readout operation, in which timing between boosting of the selected word line WL0 (application timing of the select voltage) and boosting of the non-selected word line WL1 to WLi (application timing of the non-select voltage) differs. In other words, the timing of the boosting voltage of the selected word line WL0 becomes later than that of the boosting voltage of the non-selected word line WL1 mostly adjacent to the selected word line WL0. This is because: the non-selected memory cell MC1 is adjacent to the selected memory cell MC0; and when the timings between the boosting voltage of the selected memory cell MC0 and the non-selected memory cell MC1 are same, coupling noise occurs among them; and therefore it should be avoided that the voltage of the selected word line WL0 is dragged toward the voltage of the non-selected word line WL1 and then overshot.

Explaining in more particular, in the case the timing of the boosting voltage of the selected word line WL0 and that of the boosting voltage of the non-selected word line WL1 are same, two noises is occurred. One noise a noise that is occurs at the moment the space between the selected word line WL0 and the select voltage generation circuit 62 (See FIG. 3.) is electrically connected via the CG driver 42. The load of the select voltage generation circuit 62 become large because the selected word line WL0 is charged at the moment the select voltage generation circuit 62 is connected to the selected word line WL0. Charge voltage flows into the load to undershoot the potential of the selected word line WL0. In addition, it requires a time progress the selected voltage generation circuit 62 hereafter keeps charging the load of the selected word line WL0 continuously and thus may be made converge into the select voltage Vcgrv (approximately 2V, for instance). The other noise is a coupling noise that is added to the voltage of the selected word line WL0 when the voltage of non-selected word line WL0 is boosted to the readout voltage Vread. Because the non-selected word line WL1 be adjacent to the selected word line WL0, potential of the selected word line WL0 is dragged to potential of the non-selected word line WL1 and thus overshot by the coupling noise generating between the selected word line WL0 and the non-selected word line WL1. If the select voltage Vcgrv of the selected word line WL0 undershoots or overshoots beyond the tolerance range, the select voltage Vcgrv may not launch the next step of operation until the select voltage Vcgrv is converged within the allowable range so that it takes time for the readout operation, especially the readout for program verify operation. As a consequence, data readout operation and total programming operation will be increased.

On the other hand, in the NAND type semiconductor memory 1 according to the first embodiment, as described above, a timing in which the selected voltage Vcgrv may be delayed by the boosting voltage of non-selected word lines WL1 to WLi in advance and consequently make the timing of the boosting voltage delay to let the selected word line WL0 undershoot. Further, being affected by the coupling noises from the non-selected word line WL1 to WLi, a peak, in which the selected voltage Vcgrv of the selected word line WL0 is overshot, and the timing in which the selected voltage Vcgrv of the selected word line WL0 is undershot may be close together. As a consequence, noise generated in the selected voltage Vcgrv of the selected word line WL0 may be reduced.

In the readout operation of the NAND type semiconductor memory 1 according to the first embodiment, time for delaying the timing of the boosting voltage of the selected word line WL0 for the timing of the boosting voltage of the non-selected word lines WL1 to WLi can be adjusted accordingly, by a condition of the boosting voltage and a layout condition such as a space of word line WL, width of word line WL, etc. As far as being able to obtain the above-mentioned effect, the value is not especially limited; however it is larger than zero at least. Also, the upper limit of the time delayed can be adjusted accordingly as well; however, it is required that the selected word line WL be set to the select voltage Vcgrv until the voltage of the drain side gate line SGD (See FIG. 4) has been the boosting voltage. Therefore, the upper limit of the time delayed is a time until the drain side selected gate line SGD is selected. As for the concrete numerical values of the time delayed, it is preferred to be equal or faster than 0 µs and equal or later than 1.5 µs, and more in particular, it is preferred to be set in a rage between 0.5 µs to 5.0 µs; 1.0 µs to 5.0 µs; or 1.5 µs to 5.0 µs. Further in the period during the time delayed (the period t3 to t4), it is preferred that the control electrode of the selected memory cell MC0 be in an electrically floating state, and be maintained at the voltage prior to the time t3.

Figure 8:
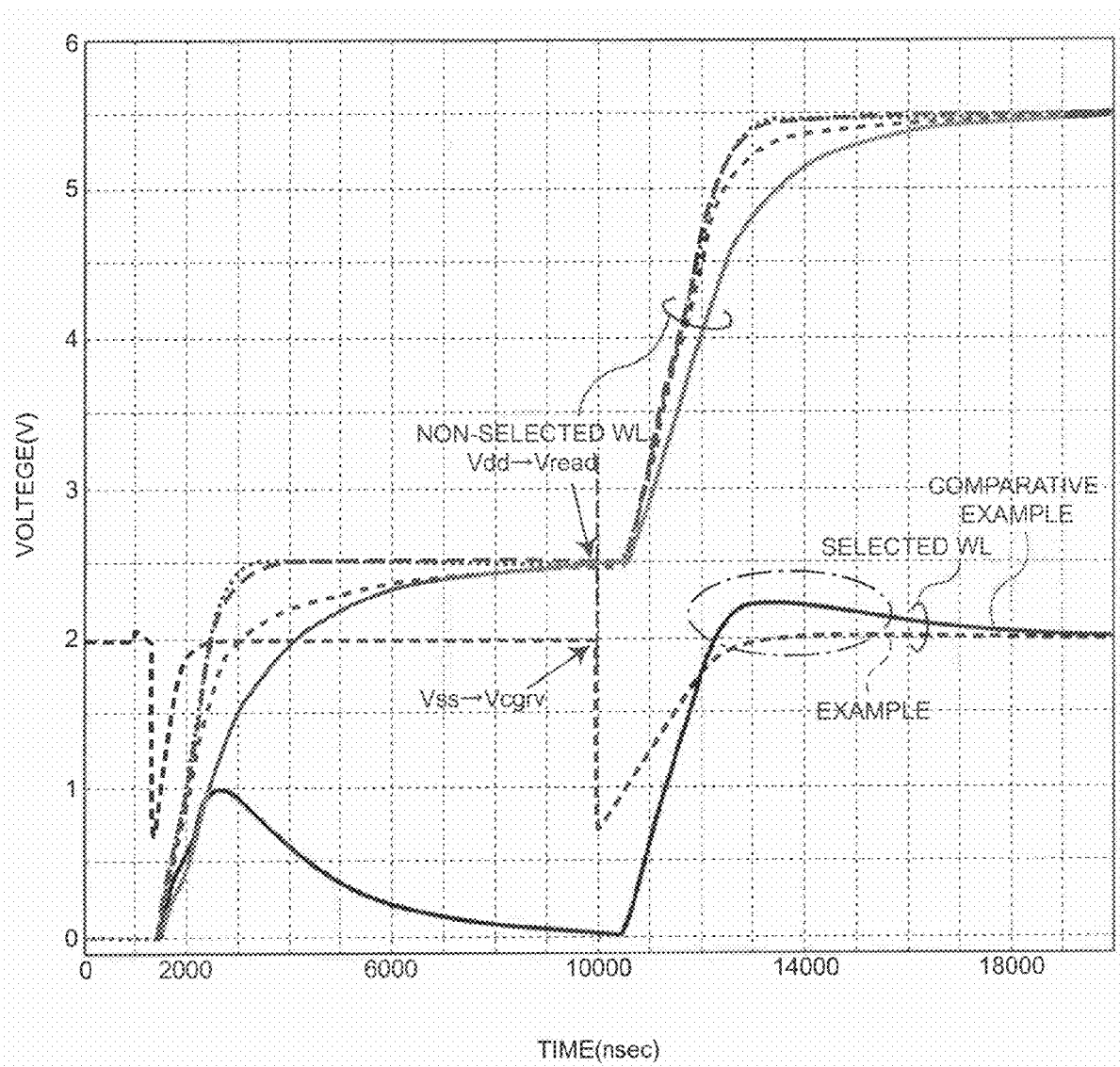
FIG. 8 is a waveform diagram showing a simulation result in the case the timings of the boosting voltage of the selected word line and the non-selected word lines are made identical in the data readout operation of the nonvolatile semiconductor memory according to a comparative example.

Firstly, as shown in FIG. 8, in a case a timing of the boosting voltage of the non-selected word line WL and that of the boosting voltage of the selected word line WL are same, at the same time the non-selected word line WL is risen up from the voltage Vdd to the non-select voltage Vread, the selected word line WL is risen up from the voltage Vss to the select voltage Vcgrv. Here, the select voltage Vcgrv is set to 2V. In a peak of the boosting voltage of the selected word line WL, as illustrated in a rounded symbol with a dashed line in the figure, the select voltage Vcgrv applied to the selected word line WL is thus dragged by the coupling capacitive generated between the selected word line WL and the non-selected word line WL, and thus the select voltage Vcgrv is overshot. Further in the figure, a plurality of voltage waveforms of the non-selected word lines WL are shown. The plurality of voltage waveforms are each of the voltage waveforms of the non-selected word lines WL in which a minimum, an intermediate, and a maximum of the coupling capacitive are respectively added, for the non-selected word lines WL differs in their coupling capacitive depending on positions deposited on the memory cell array 2.

Figure 5:
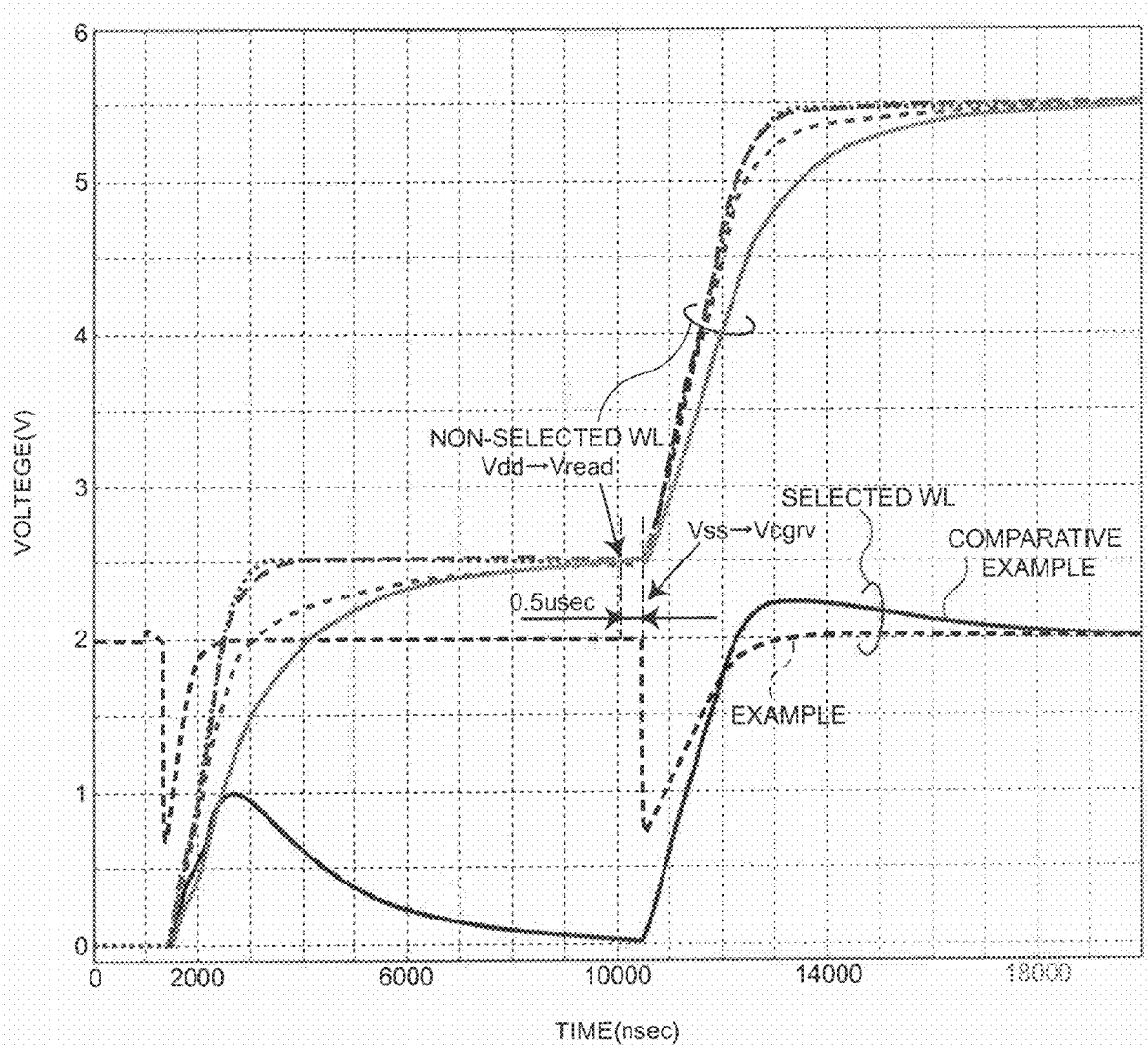
FIG. 5 is a first waveform diagram showing a simulation result in the case timing of the boosting voltage of the selected word line is made delay for 0.5 µs as compared to timing of the boosting voltage of the non-selected word lines, in a data readout operation of the nonvolatile semiconductor memory according to the first embodiment.
Figure 6:
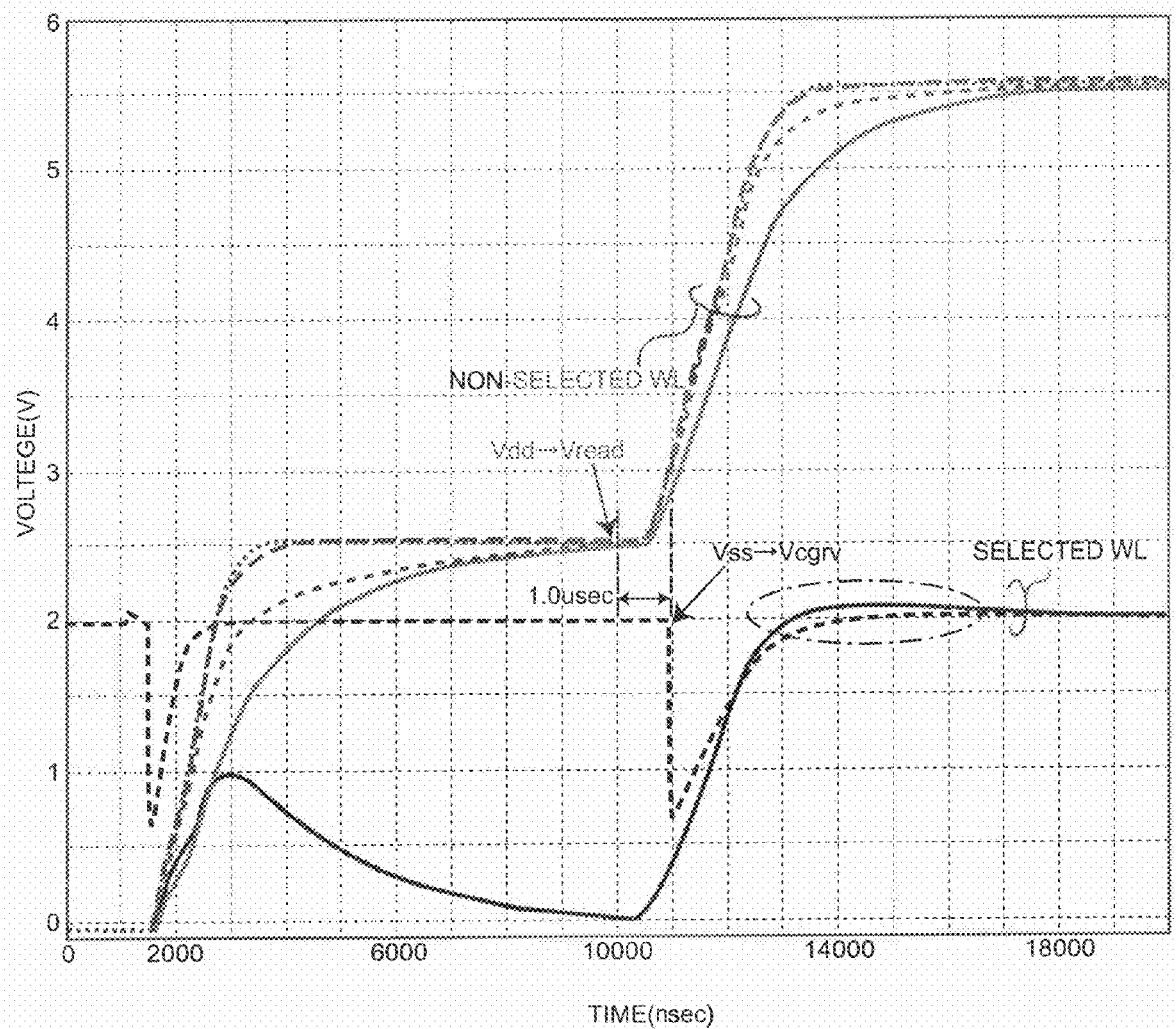
FIG. 6 is a second waveform diagram showing a simulation result in the case the timing of the boosting voltage of selected word line is made delay for 1.0 µs as compared to the timing of the boosting voltage of the non-selected word lines in the data readout operation of the nonvolatile semiconductor memory according to the first embodiment.
Figure 7:
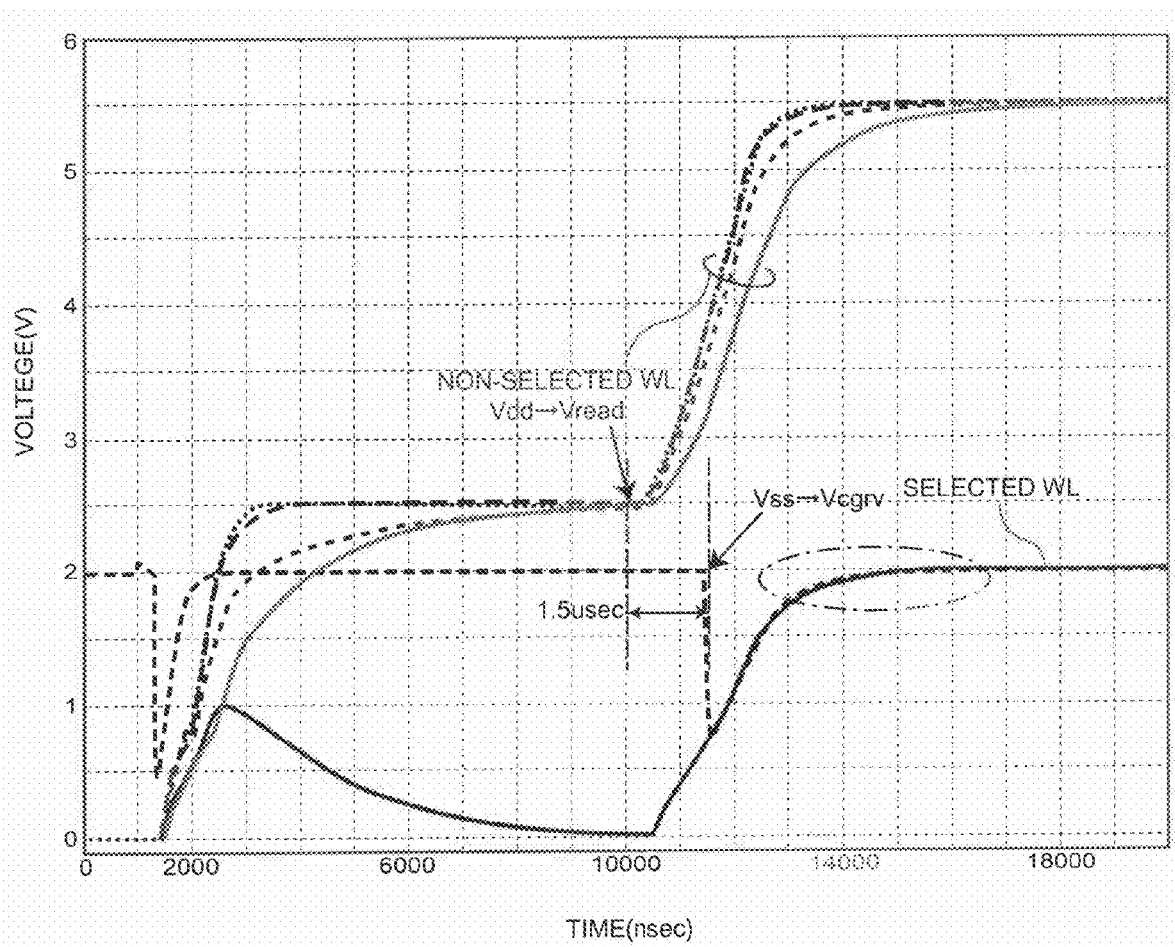
FIG. 7 is a third waveform diagram showing a simulation result in the case the timing of the boosting voltage of the selected word line is made delay for 1.5 µs as compared to the timing of the boosting voltage of the non-selected word lines in the data readout operation of the nonvolatile semiconductor memory according to the first embodiment.

On the other hand, as shown in FIG. 5, an overshoot of the select voltage Vcgrv may be reduced by delaying the timing of the boosting voltage of the selected word line WL for 0.5 µs as compared to the timing of the boosting voltage of the non-selected word line WL. Further, as shown in FIG. 6, an overshoot of the select voltage Vcgrv may be reduced by delaying the timing of the boosting voltage of the selected word line WL for 1.5 µs as compared to the timing of the boosting voltage of the non-selected word line WL. In addition, as shown in FIG. 7, in the case the timing of the boosting voltage of the selected word line WL is made delay for 1.5 µs as compared to the timing of the boosting voltage the non-selected word line WL, an overshoot of the select voltage Vcgrv may be even more reduced as compared to the case of delaying the timing for 0.5 µs or 1.0 µs. In the case the timing of the boosting voltage for 1.5 µs, the coupling noise added to the selected word line WL may become zero in substance. Therefore, the time for setting up of the word line WL may be reduced and thus, speedup for the velocity of data readout operation and the data program operation may be realized.

In addition, the voltage waveforms of the non-volatile word lines WL shown in FIG. 5 to FIG. 8, is an example, where voltage is once made step up to a voltage Vss to a voltage Vdd and then step up to the non-select voltage Vread. However, in the NAND type nonvolatile semiconductor memory 1 according to the first embodiment, even if the voltage of non-selected word line WL is boosted to the non-select voltage Vread at a stretch, the same effect may be obtained.

[Configuration of Select Voltage Generation Circuit]

Figure 9:
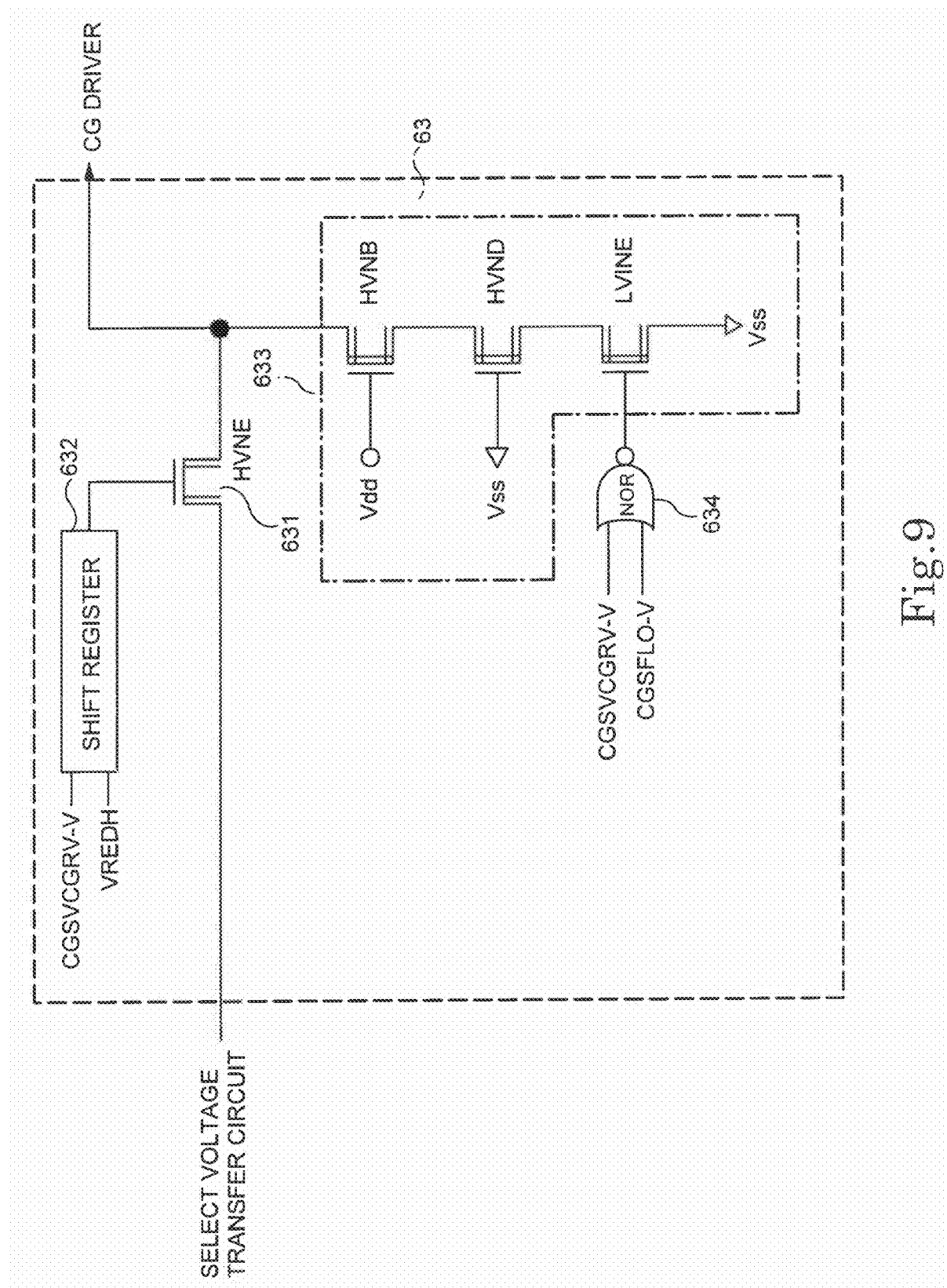
FIG. 9 is a circuit diagram of a select voltage transfer circuit of a control signal generation circuit according to the first embodiment.

In the next place, a concrete circuit configuration in which the data readout operation the NAND type nonvolatile semiconductor memory 1 according to the first embodiment is realized. The select voltage transfer circuit 63 of the control signal generation circuit 6 shown in the above-mentioned FIG. 3, as shown with simplification in FIG. 9, is at least provided with: a program switching element (HVNE) 631; a level shifter 632 that controls the program switching element 631; a Vss discharge circuit 633; and a two-input NOR circuit 634 by which the Vss discharge circuit 633 is controlled.

The program switching element 631 is configured, for instance, to a n-channel transistor. One end of the program switching element 631 is connected to the select voltage generation circuit 62, and the other end is connected to the CG driver 42 and the Vss discharge circuit 633. The gate electrode is connected to the shift register 632. To the shift register, a CGSVCGRV-V signal, in which a continuity control of the program switching element 631 is performed in the case the word line WL is selected, and a VREADH signal, in which a continuity control of the program switching element 631 is performed in the case the word line WL is non-selected, are input. To the two-input NOR circuit 634, the CGSVCGRV-V signal and a CGSFLO-V signal, in which the word line WL is controlled to a floating state. The Vss discharge circuit 633 is provided with the n-channel transistor LVNE and two n-channel transistors HVND, which are electrically connected in series between the CG driver 42 and the voltage Vss.

In the select voltage transfer circuit 63, the voltage transmit transistor 41 (See FIG. 3.) become in an on-state, and after the voltage of the non-selected word line WL is boosted at a time t3, the word line WL may become in a floating state in a period of a time t3 and a time t4 (and after a time t6). Further in the select voltage transfer circuit 63, in a period of the time t4 and the time t6, the select voltage may be supplied to the word line WL.

Figure 10:
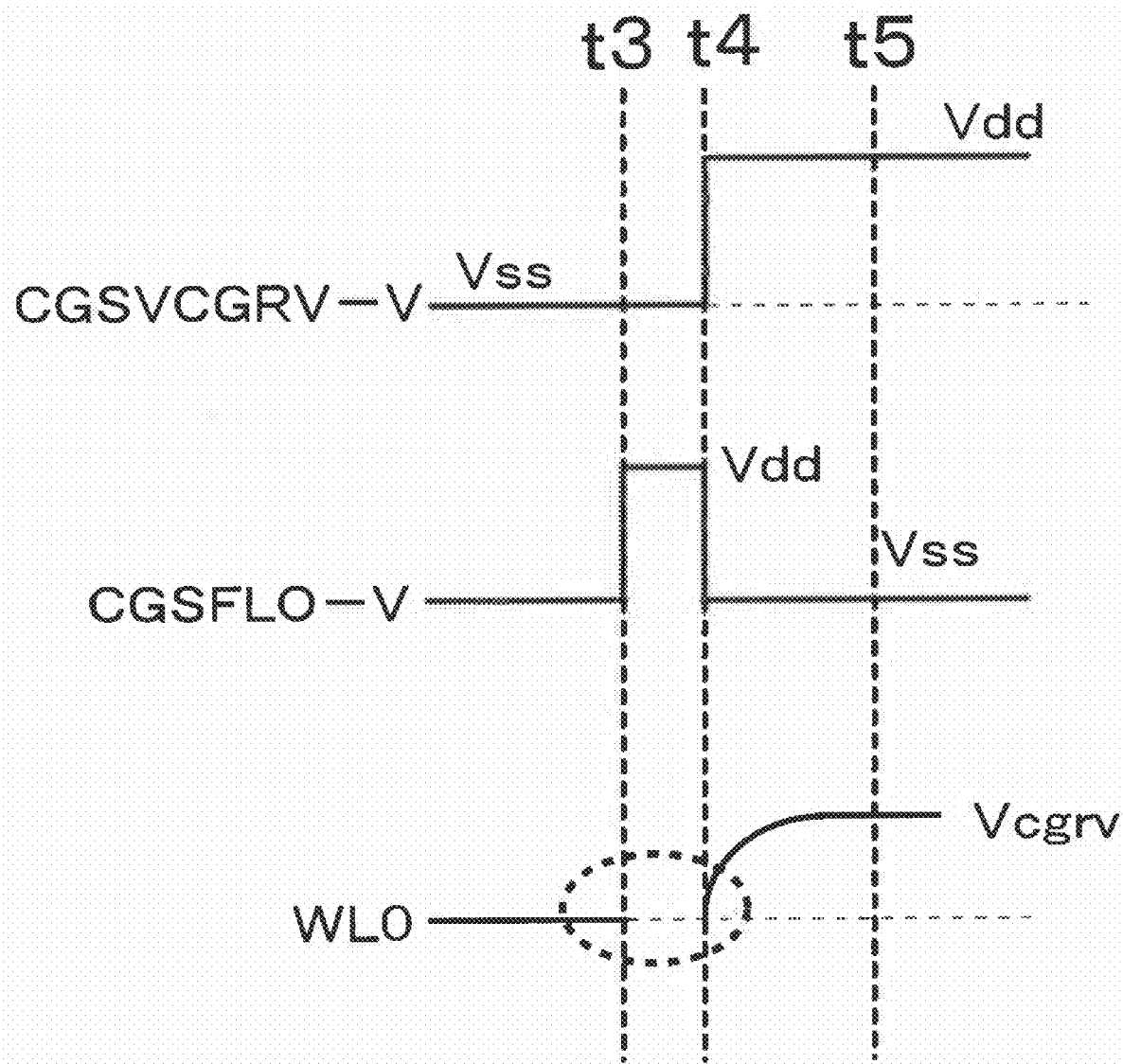
FIG. 10 is a timing chart explaining an operation of the select voltage transfer circuit shown in FIG. 9.

Here, an operation of the select voltage transmit circuit 63 shown in FIG. 9 will be explained. Waveforms (voltage waveforms) of the CGSVCGRV-V signal and the CGSFLO-V signal that are input to the two-input NOR circuit 634, and a waveform of the selected word line WL especially that of approximately the time t3 to the time t5 are shown in FIG. 10. The CGSVCGRV-V signal and the CGSFLO-V signal that are input to the two-input NOR circuit 634 of the select voltage transfer circuit 63, is either at a voltage Vss level (a low level) at a time before reaching for the time t3. Then, the n-channel transistor LVNE of the Vss discharge circuit 633 is in an on-state, and the selected word line WL0 is set to the voltage Vss.

Next, in a period of the time t3 and the time t4, the CGSVCGRV-V signal is in a state where the voltage Vss level is kept, and the CGSFLO-V signal is made risen up to the voltage Vdd level from the voltage Vss level. When this occurs, the n-channel transistor LVNE of the Vss discharge circuit 633 that transmits the voltage Vss becomes in an off-state, and the program switching element (HVNE) 631 that transmits the select voltage becomes in an off-state. Therefore, the source of supply of the selected word line WL is cut off, which as a consequence becomes the floating state.

Next, at the time t5, the CGSVCGRV-V signal is risen up to the voltage Vdd from the voltage Vss, then is fallen down from the voltage Vdd to the voltage Vss. As a consequence, the n-channel transistor LVNE of the Vss discharge circuit 633 is kept at an off-state, and the supply of the voltage Vss from the Vss discharge circuit 633 is cut off. On the other hand, the transistor for programming 631 becomes to an on-state. Therefore, the select voltage Vcgrv may be supplied to the selected word line WL0.

[Cross Sectional Structure of Memory Cell Array]

Figure 11:
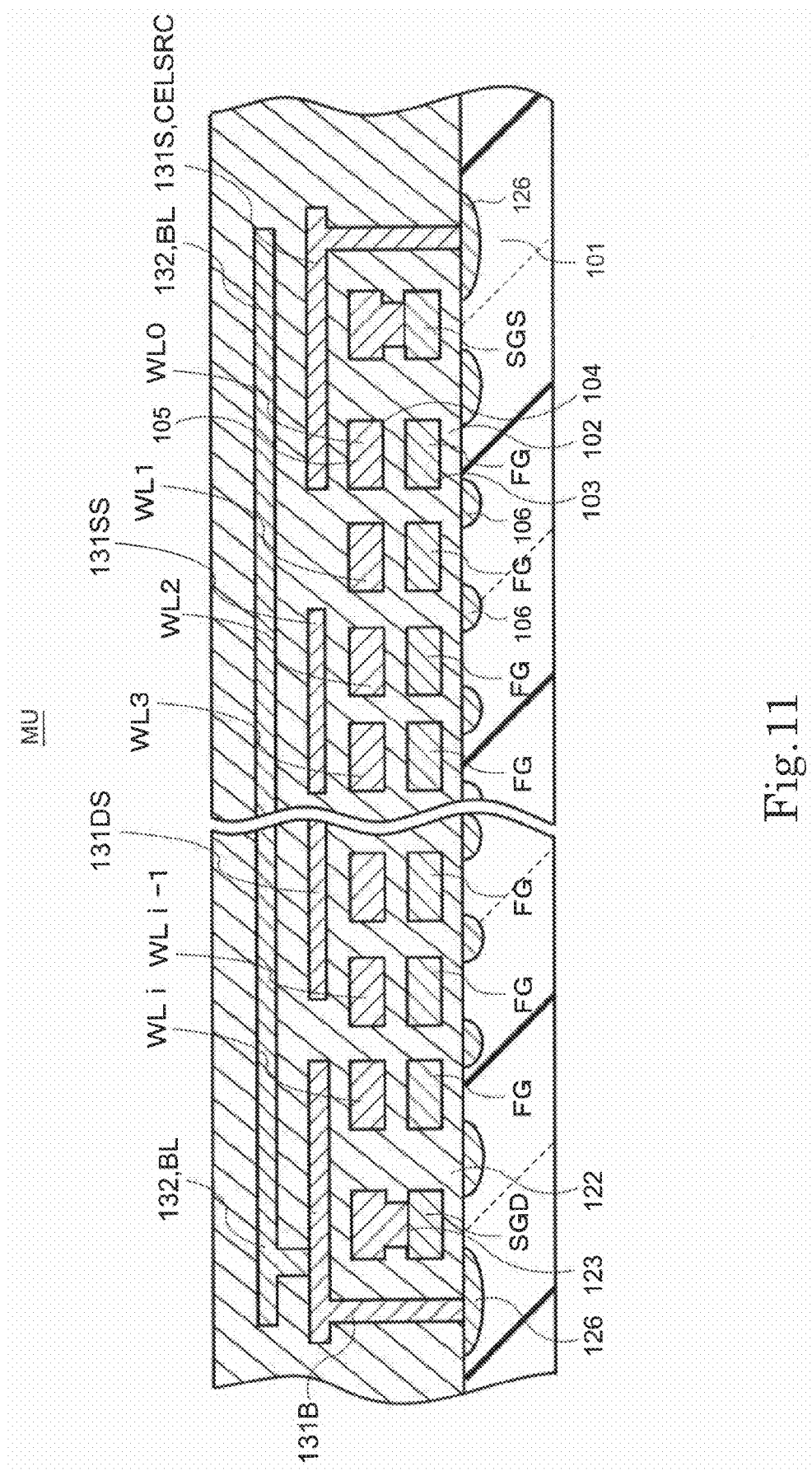
FIG. 11 is a cross section structural view of a substantial section of the nonvolatile semiconductor memory according to the first embodiment.

A concrete sectional structure of the memory unit MU arranged into a memory cell array of the NAND type nonvolatile semiconductor memory 1 is shown in FIG. 11. This figure is a cross sectional view, in which one memory unit MU is cut off in the section that pass through both of the source side selection transistor S1 and the drain side selection transistor S2, coincides with a longitudinal direction of the channel of the memory cell MC. The NAND type semiconductor memory 1 is configured based on a substrate 101. In the substrate 101, for instance a single crystal silicon substrate may be used practically.

A plurality of memory cells MC1 to MCi are either provided with: the substrate 101 (or a well region formed in the main surface of the substrate 101 (the p type semiconductor region)); a first gate insulation film 102 on the substrate 101; an electric charge accumulation layer (a floating gate electrode) 103 of the first gate insulation film 102; a second gate insulation film 104 on the electric charge accumulation layer 103; a control electrode (a control gate electrode) 105 on the second gate insulation film 104; and the source region and the drain region 106. The first gate insulation film 102 is a tunnel insulation film. In the electric charge layer 103, for instance, a poly crystal silicon film may be used practically. In a control electrode 105, either single layer film of the poly crystal silicon film, a refractory metal silicide film, or a refractory metal film, or the composition film in which the refractory metal silicide film or the refractory metal silicide film are stack on the poly crystal silicon film, may be practically used. The control electrode 105 is formed with the same layer and the same materials with the word line WL, and is formed to the word line WL integrally. The source region and the drain region 106 are formed on the main surface of the substrate 101, and the n-type semiconductor region in the first embodiment.

The source side selection transistor S1 and the drain side selection transistor S2 are provided with a memory cells MU, a substrate 101, a gate insulation film 122 on the substrate 101, a gate electrode 123 on the gate insulation film 122, and the source region and the drain region 126. The gate electrode 123 is configured, electrically short-circuiting a lower layer formed by the same layer and the same material with the electric charge accumulation layer 103 of the memory cell MC and an upper layer formed by the same layer and the same materials with the control electrode 105. The source region and the drain region 126 are formed by the manufacturing process which is identical with the manufacturing process of the source region and the drain region 106.

In the source region 126 of the source side selection transistor S1, a cell source line (CELSRC) 131S is electrically connected. For the cell source line 131S, the refractory metal film, for instance, a tungsten film may be practically used. To the gate electrode 123 of the source side selection transistor S1, a source side shunt wiring 131SS is electrically connected, which crosses a memory cell unit MU, and most of which is extended toward the cell source line 131S. The source side shunt wiring 131SS configures a source side selected gate line SGS, and is formed by the same layer and the same materials with the cell source line 131S.

To the drain region 126 of the drain side selection transistor S2, a bit line (BL) 132 is electrically connected via a transit wiring 131B. For the bit lines 132, a low-resistance materials, for instance, a copper film or an aluminum alloy film may be practically used. The transit wiring 131B is formed by the same layer and the same materials with the cell source line 131S. To the gate electrode 123 of the drain side selection transistor S2, the drain side shunt wiring 131DS is electrically connected, which crosses a memory cell unit MU, and most of which is extended toward the cell source line 131S, is electrically connected. The drain side shunt wiring 131DS configures the drain side selected gate line SGD, and is formed by the same layer and the same materials with the cell source line 131S.

However showing with simplification in FIG. 11, the memory cell MC, the source side selection transistor S1, the drain side selection transistor S2, the cell source line 131S, and the bit line 132 and such are covered with a passivation film.

[Data Retentiveness Characteristics of Memory Cell Array]

Figure 12:
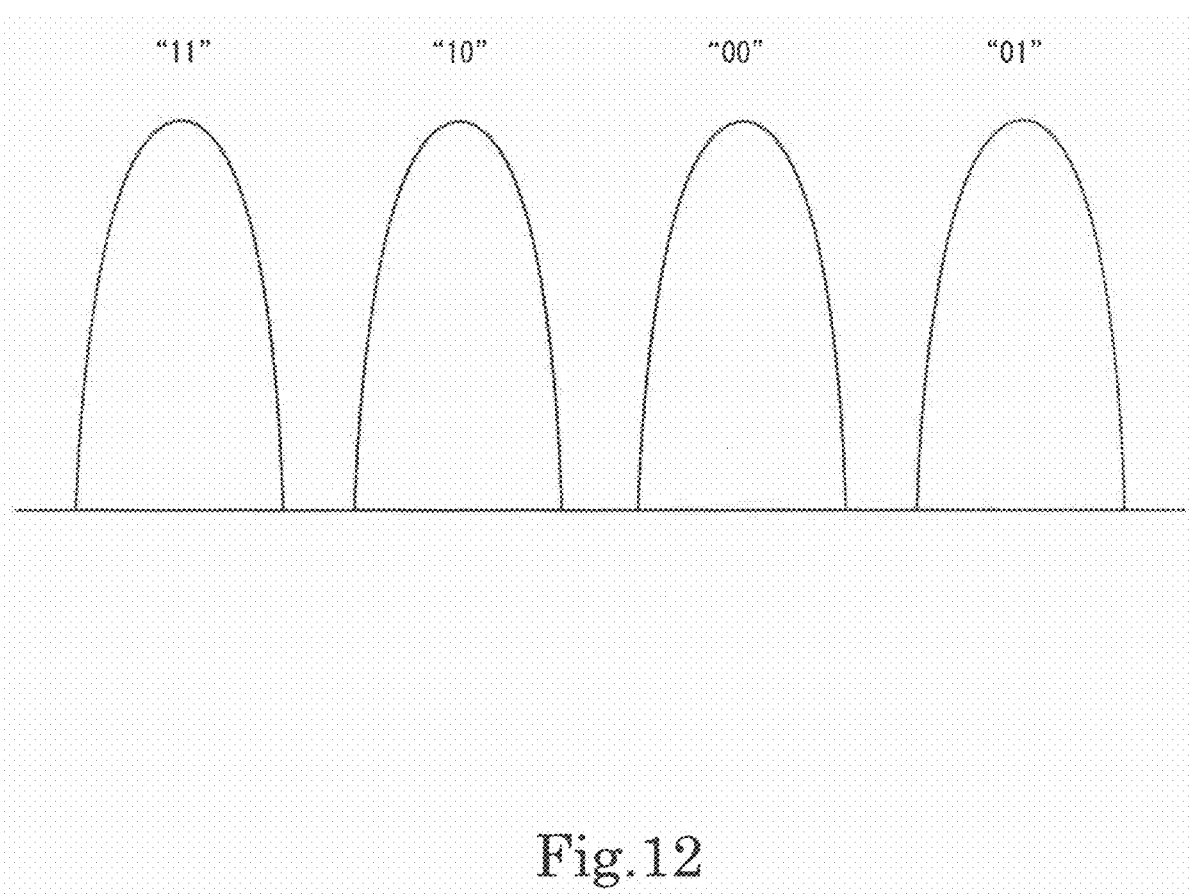
FIG. 12 is a diagram showing a threshold level of data stored in the memory cells of the nonvolatile semiconductor memory according to the first embodiment.

The memory cell MC of the NAND type nonvolatile semiconductor memory 1 according to the first embodiment has four threshold voltage level, as shown in FIG. 12. In other words, in the memory cell, quaternary data in total, "11", "10", "00" and "01", may be stored.

Further in the NAND type semiconductor memory 1 according to the first embodiment, the memory cell MC is not limited to storing the quaternary value data; binary value data "1" "0" may be stored, and multiple value data such as ternary value or more than quaternary value data may be stored.

[A System Configuration of Memory Card]

Figure 13:
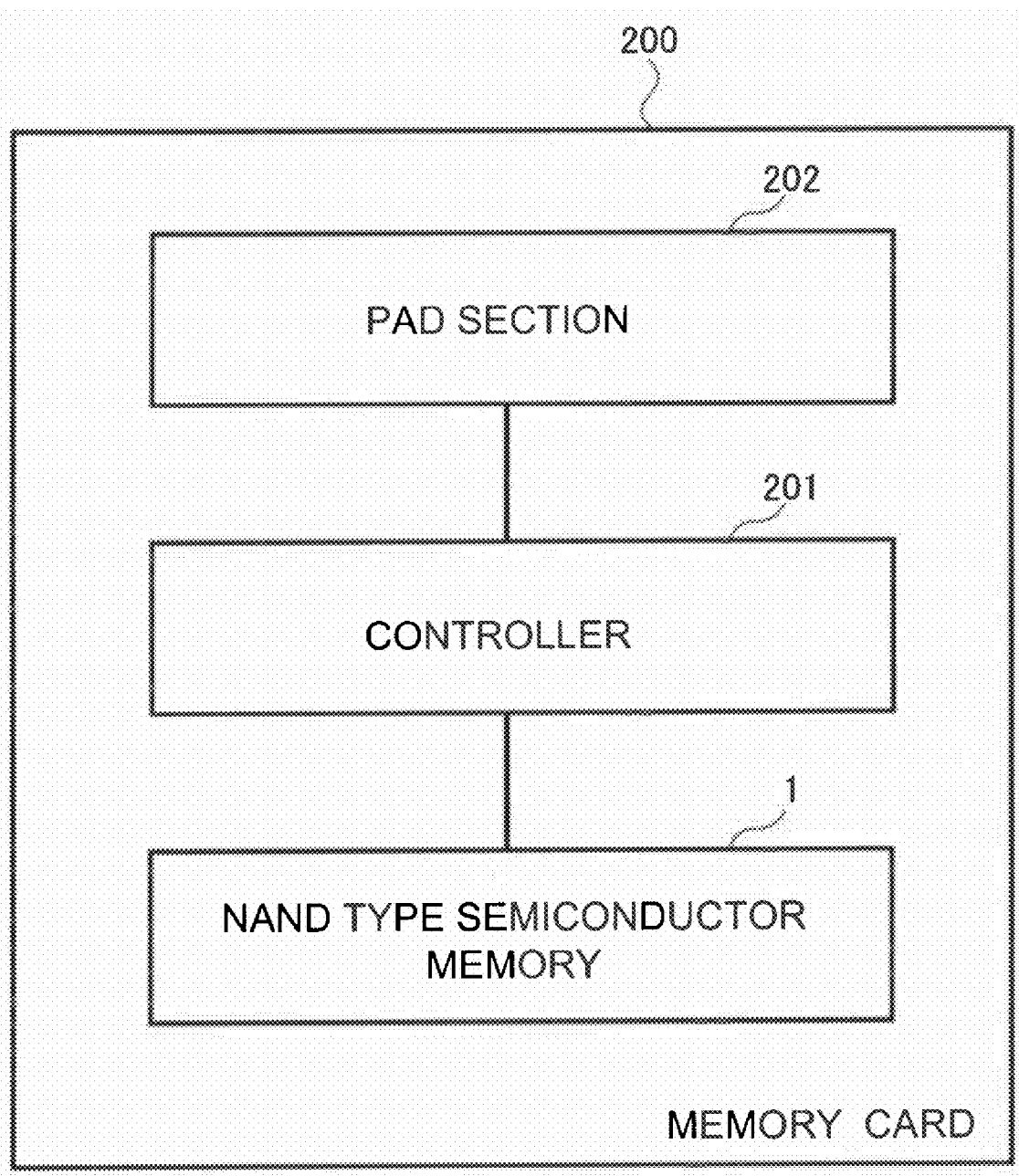
FIG. 13 is a system configuration diagram of a memory card on which the nonvolatile semiconductor memory according to the first embodiment is mounted.

In the first embodiment shown in the above-described FIG. 1, the NAND type semiconductor memory 1 may be constructed as a semiconductor device mounted on 1 chip, or as a memory module in which the one semiconductor device or a plurality of the semiconductor is implemented. And further as shown in FIG. 13, the NAND type semiconductor memory 1 may be constructed as a memory card 200. The memory card 200 is provided with: one (or a plurality of) NAND type nonvolatile semiconductor memory 1 mounted on a card substrate; a controller 201 controlling the NAND type nonvolatile semiconductor memory 1; and a pad section 202. The pad section 202 connects a space between the NAND type nonvolatile semiconductor memory 1 and an exterior apparatus of the memory card 200 (not shown in the figure) and performs input of the control signal and input of power or input/output of data.

In the data readout operation or the data program operation of the NAND type nonvolatile semiconductor memory 1 according to the first embodiment configured like this, timing of the boosting voltage of the selected word line WL is made delay for that of the boosting voltage of the non-selected word line WL. Therefore, coupling noise generating on the selected word line WL may be reduced. As a consequence, an error on operation may be prevented, and thus a reliability on an operation of the NAND type nonvolatile semiconductor memory 1 may be improved.

Further, because the reliability on the operation of the NAND type nonvolatile semiconductor memory 1 may be improved, the reliability on the operation of the memory card 200, on which the NAND type nonvolatile semiconductor memory 1 is installed, may be improved.

The Second Embodiment

The second embodiment of the present invention, in the NAND type nonvolatile semiconductor memory 1 according to the first embodiment described above, explains an example, in which each of operation orders of the source side selection transistor S1 and the drain side selection transistor S2 may be changed according to the position of the selected memory cell MC of the memory cell unit MU. Further, the second embodiment explains an example, in which a level of the step-up voltage of the word line according to places of the selected memory cell MC of the memory cell unit MU.

In addition in the second embodiment, the same symbols are added to the same elements that are same to the elements explained in the first embodiment. An explanation for the same elements is omitted because such explanation duplicates except it is required.

Figure 21:
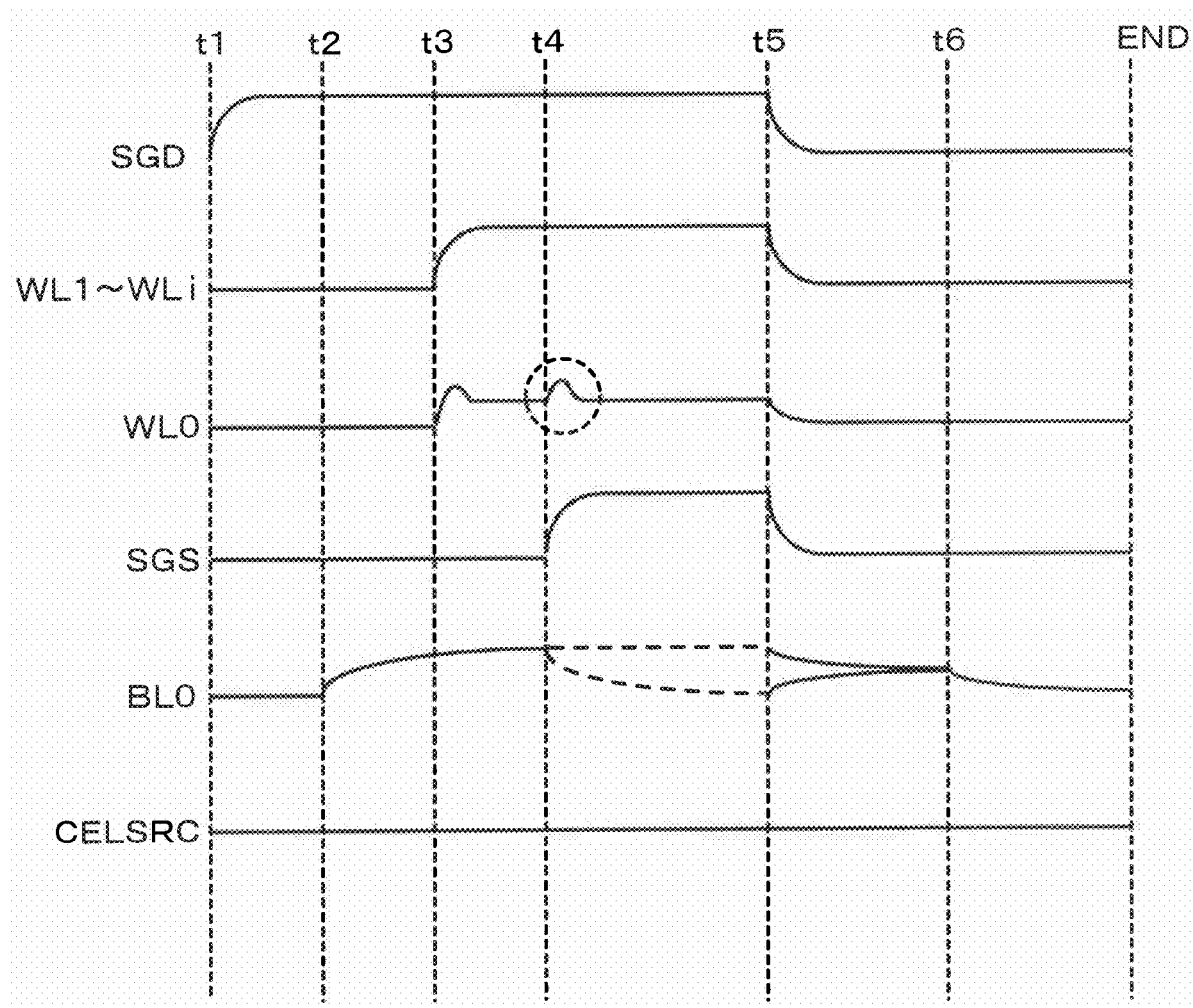
FIG. 21 is a timing chart explaining the readout operation of the nonvolatile semiconductor memory according to a comparative example.
Figure 22:
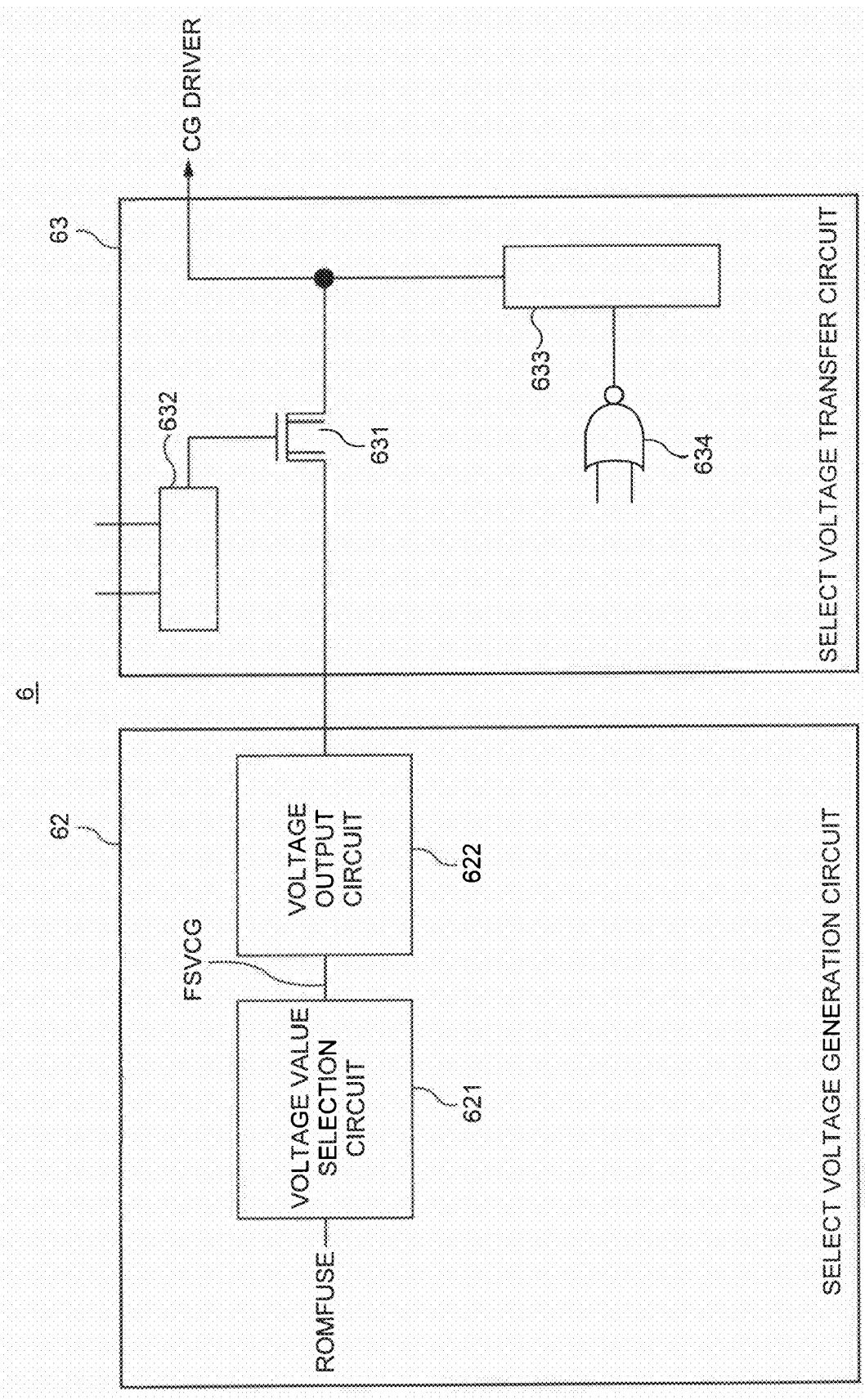
FIG. 22 is a block diagram of a control signal generation circuit according to the second embodiment.

In the memory cell array 2 of the NAND type nonvolatile semiconductor memory 1 according to the first embodiment shown in the above-described FIG. 2, when selecting a memory cell MC0 adjacent to the source side selection transistor S1, the selected word line WL0 is affected by a coupling noise is occurred as shown in FIG. 21 with a dashed line surrounding, accompanying with the boosting voltage of the source side selected gate line SGS. FIG. 21 shows a timing chart (a voltage waveform) of a drain side selected gate SGD, a selected word line WL0, a non-selected word line WL1 to WLi, a source side selected gate line SGD, a selected word line WL0, a non-selected word line WL1 to WLi, the source side selected gate line SGS, and the selected bit line BL0, respectively.

Because the selected memory cell MC0 is adjacent to a source side selected gate line SGS without one memory cell intervening, a level of the boosting voltage (a voltage level) of the selected word line WL0 is overshot affecting a coupling noise, if the voltage of the source side selected gate line SGS is boosted at the time t4. Because the drain side selected transistor S2 is also in an on-state, especially at the time t4, in the case the data read out is "1", if the selected memory cell MC0 is conducted affecting the coupling noise, electric discharge of the selected bit line BL0 occurs. In a state where a high voltage that is overshot to the selected word line WL0 is applied, because electric discharge of the bit line BL is launched, the threshold voltage of the selected memory cell MC seems to be lower than a value intended. Such tendency is even more remarkable by narrowing of a wiring interval of the word lines and such by further miniaturization processing.

Also in the NAND type nonvolatile semiconductor memory 1, the memory cell unit MC connects a plurality of memory cells MC electrically. The respective channel region of the memory cell MC, on a data readout operation, is current paths, in which electric charge charged into the selected bit line BL is flown into the cell source line SELSRC. The select voltage of the selected word line WL0 is also affected by the coupling noise that generates between a space of such current paths This inventors and the like eagerly conducted an examination. As a consequence, on a data readout operation of the NAND type nonvolatile semiconductor memory 1, they assumed that a coupling noise of a space, between the source side gate line SGS of source side selected transistor S1 or the drain side gate line SGD of drain side selected transistor S2 and the selected word line WL, may be reduced, by making either one of the source side selection transistor S1 of one end of the memory cell unit MU or the drain side selection transistor S2 of the other end perform an on-operation prior to the counterpart, depending on a arrangement position of the selection memory cell MC of memory cell unit MU, and thus completed the present invention. Further, this inventors and the like assumed that a coupling noise may be reduced, which occurs in the select voltage of the selected word line WL, which occurs among a space of current paths which a channel region of the memory cell unit MU, by correcting voltages applied to the selected word line WL depending on an order of the on-operation of the selection transistor S1, S2, and thus completed the present invention.

[Configuration of NAND Type Nonvolatile Semiconductor Memory]

A system configuration of the NAND type nonvolatile semiconductor memory 1 according to the second embodiment is basically the same to the system configuration of the NAND type nonvolatile semiconductor memory 1 according to the first embodiment shown in the above-described FIG. 1. In addition, the circuit configuration of memory cell array 2 of the NAND type nonvolatile semiconductor memory 1 is same to the circuit configuration of the memory cell array 2 shown in the above described FIG. 2. The sectional structure of memory cell unit MU is the same to the sectional structure of the memory cell unit MU shown in the above described FIG. 11.

Here in the NAND type nonvolatile semiconductor memory 1 according to the first embodiment 1 showing in the above described FIG. 11, it is necessary to save capacity in a space between the electric charge accumulation layer 103 of the memory cell MC and the control electrode 105 (a word line WL), and a that between the substrate 101 (a channel region) and the electric charge accumulation layer 103, respectively, to improve the data program characteristics. On the other hand, because of the wiring is required to be minute, it is necessary to make small and to narrow each of alienation distance of space among the source side gate line SGS, the drain side gate line SGS, the word line WL, the source side selected gate line SGS, and that between the drain side selected gate line SGD and the word line WL. Therefore, influence of coupling noises becomes large especially in the space between the source line side selected gate line SGS and the word line WL, and that between the drain side selected gate line SGD and the word line WL.

In addition, in the NAND type nonvolatile semiconductor memory 1, a source side shunt wiring 131SS is connected to the source side selected gate line SGS, and the drain side shunt wiring 131D is connected to the drain side selected gate line SGD. These source side shunt wiring 131SS and the drain side shunt wiring 131DS is positioned duplicated on the word lines WL. As a result, coupling noises also occur between each of the source side selected gate line SGS, drain side selected gate line SGD, and the word lines WL. Further explained in detail, the drain side shunt wiring 131DS is connected to the drain side selected gate line SGD that is positioned on the same memory block, and the source side shunt wiring 131SS is connected to the source side selected gate line SGS positioned on the adjacent memory block. Therefore, if the drain side gate line SGD is charged after the source side selected gate line SGS, in the selected memory cell MC, a coupling noise from the drain side shunt wiring 131S is received when the selected memory cell MC is positioned under the drain side shunt wiring 131DS.

In the NAND type nonvolatile semiconductor memory 1 according to the second embodiment, such influence of coupling noise may be reduced on the data readout operation.

[Data Readout Operation]

Next, the data readout operation of the NAND type nonvolatile semiconductor memory 1 according to the second embodiment is explained referring to the circuit diagram showing in FIG. 2 with FIG. 4. The timing chart in FIG. 4 is a timing chart, in which data stored in the memory cell MC0 adjacent to the source side selection transistor S1 are read out, in the memory cell unit MU0 showing in FIG. 2.

The NAND type nonvolatile semiconductor memory 1 according to the second embodiment applies, at first at a time t1, a voltage Vsg is applied to the source side selected gate line SGS. Next at a time t2, a voltage Vb1 is applied to the selected bit line BL0. Then at a time t3, voltages are applied to the non-selected word lines WL1 to WLi that is connected to the non-selected memory cells MC1 to MCi other than the selected word line WL0 and the selected memory cell MC0 that is connected to the selected memory cell MC0. The non-select voltage Vread is applied to the non-selected word lines WL1 to WLi, and the select voltage Vcg (=Vcgrv−ΔV) is applied to the selected word lines WL0. Afterwards, at a time t4, the voltage Vsg is applied to the drain side selected gate line SGD and then makes the drain side selection transistor S2 be in an on-state. This means that, by a series of data readout operation, the drain side selection transistor S2, the source side selection transistor S1, and the non-selected memory cell MC1 to MCi become in an on-state, and a voltage change occurs in the selected bit line BL0 depending on either data "0" is stored or the data "1" is stored. At the time t4, data may be read out by judging the voltage change of the selected bit line BL0.

On the other hand in the memory cell unit MU0 showing the above-described FIG. 2, when data stored in the memory cell MCi adjacent to the drain side selection transistor S2, in the NAND type nonvolatile semiconductor memory 1 according to the second embodiment, timing for applying the voltage to the source side selected gate line SGS and that for applying the voltage to the drain side selected gate line SGD are set to be in a reverse order. A timing chart of data readout operation is shown in FIG. 5. At first at a time t1, a voltage Vsg is applied to the drain side selected gate line SGD. Next at a time t2, a voltage Vb1 is applied to the selected bit line BL0. Then at a time t3, a voltage is applied to the non-selected word lines WL0 to WLi-1. To the non-selected word lines WL0 to WLi-1, the non-select voltage Vread is applied. To the selected word line WLi a select voltage Vcg (=Vcgrv) is applied. Afterwards at a time t4, the voltage Vsg is applied to the source side selected gate line SGS, and thus let the source side selection transistor S1 be in an on-state. By a series of data readout operation, at a time t4, a voltage change of the selected bit line BL0 is judged.

By performing the above described data readout operation, in the NAND type nonvolatile semiconductor memory 1 according to the second embodiment, in the case the selected memory cell MC0 is adjacent to the source side selected gate line SGS, coupling noise occurring between the selected word line WL0 and the source side selected gate line SGS may be reduced. In the case the selected memory cell MCi is adjacent to the drain side selected gate line SGD, coupling noise occurring between the selected word line WLi and the drain side gate line SGD may be reduced. To be concrete, when a data readout operation of the selected memory cell MC0 adjacent to the source side selected gate line SGS is performed, the coupling noise occurring in the selected word line WL0 among the space of source side selected gate line SGS may be reduced, by the boosting voltage of the source side gate line SGS, even though the voltage of the selected word line WL0 corresponding to the selected memory cell MC0 is boosted. After reducing the coupling noise, the voltage of the drain side selected gate line SGD is boosted so that a voltage change of the selected bit line BL0 may be judged. Also, in the case a data readout operation of the selected memory cell MCi that is adjacent to the drain side selected gate line SGD, by the boosted voltage of the drain side selected gate line SGD, the coupling noise occurring in the selected word line WLi among the space of the drain side selected gate line SGD may be reduced, even though the voltage of the selected word line WLi corresponding to the selected memory cell MCi is boosted. After reducing the coupling noise, the voltage of the source side selected gate line SGS is boosted so that the voltage change of the selected bit line BL0 may be judged. Therefore, data stored in the selected memory cell MC0, MCi may be read out precisely.

Figure 16:
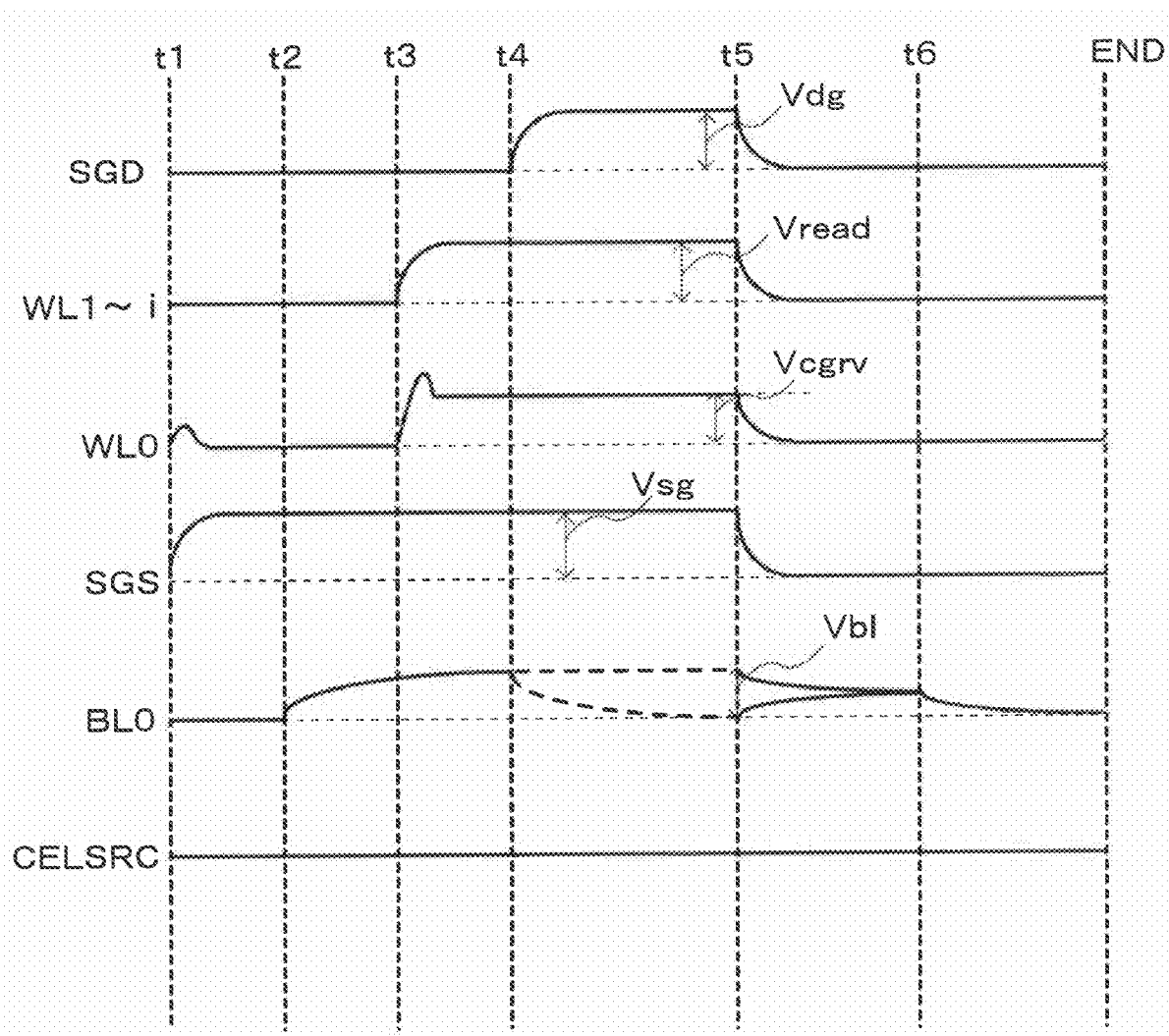
FIG. 16 is a third timing chart explaining the readout operation of the nonvolatile semiconductor memory according to the second embodiment.
Figure 17:
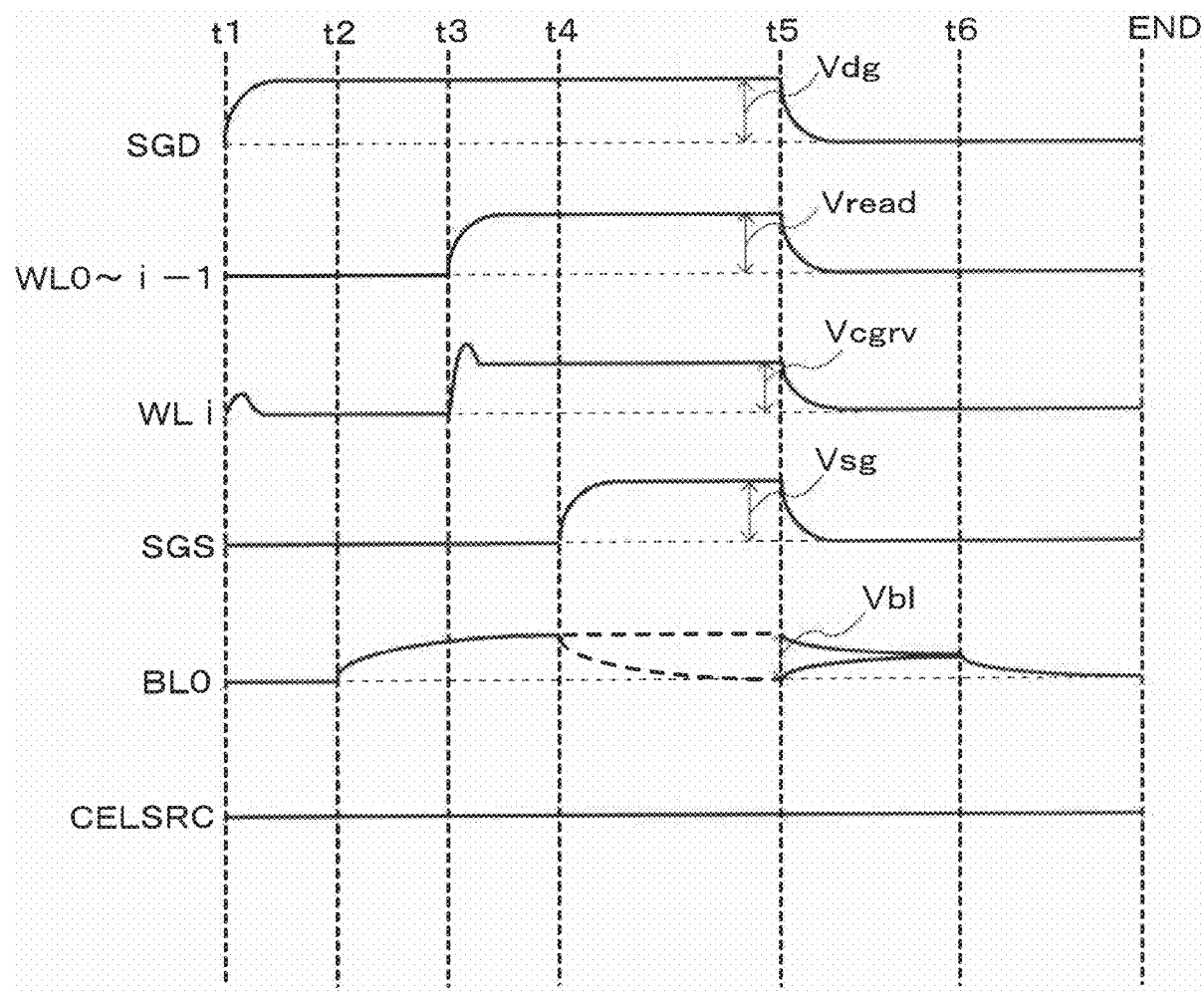
FIG. 17 is a fourth timing chart explaining the readout operation of the nonvolatile semiconductor memory according to the second embodiment.

Here, in the memory cell unit MC to which the selected memory cell MC belongs to, a timing chart will be explained, which is in a state that the selected memory cell MC does not receive any influences by the coupling noise that occurs among the channel region. A timing chart shown in FIG. 16 is a timing chart that shows a data readout operation stored in the selected memory cell MC (selected word line WL0) adjacent to the source side selection transistor S1 (the source side selected gate line SGS). A timing chart shown in FIG. 17 is a timing chart that shows a data readout operation stored in the selected memory cell MC1 (where the selected word line is WLi) adjacent to the drain side selection transistor S2 (drain side selected gate line SGD). Further in these timing charts, the same select voltage Vcgrv is applied respectively to the selected word line WL0, WLi.

Figure 14:
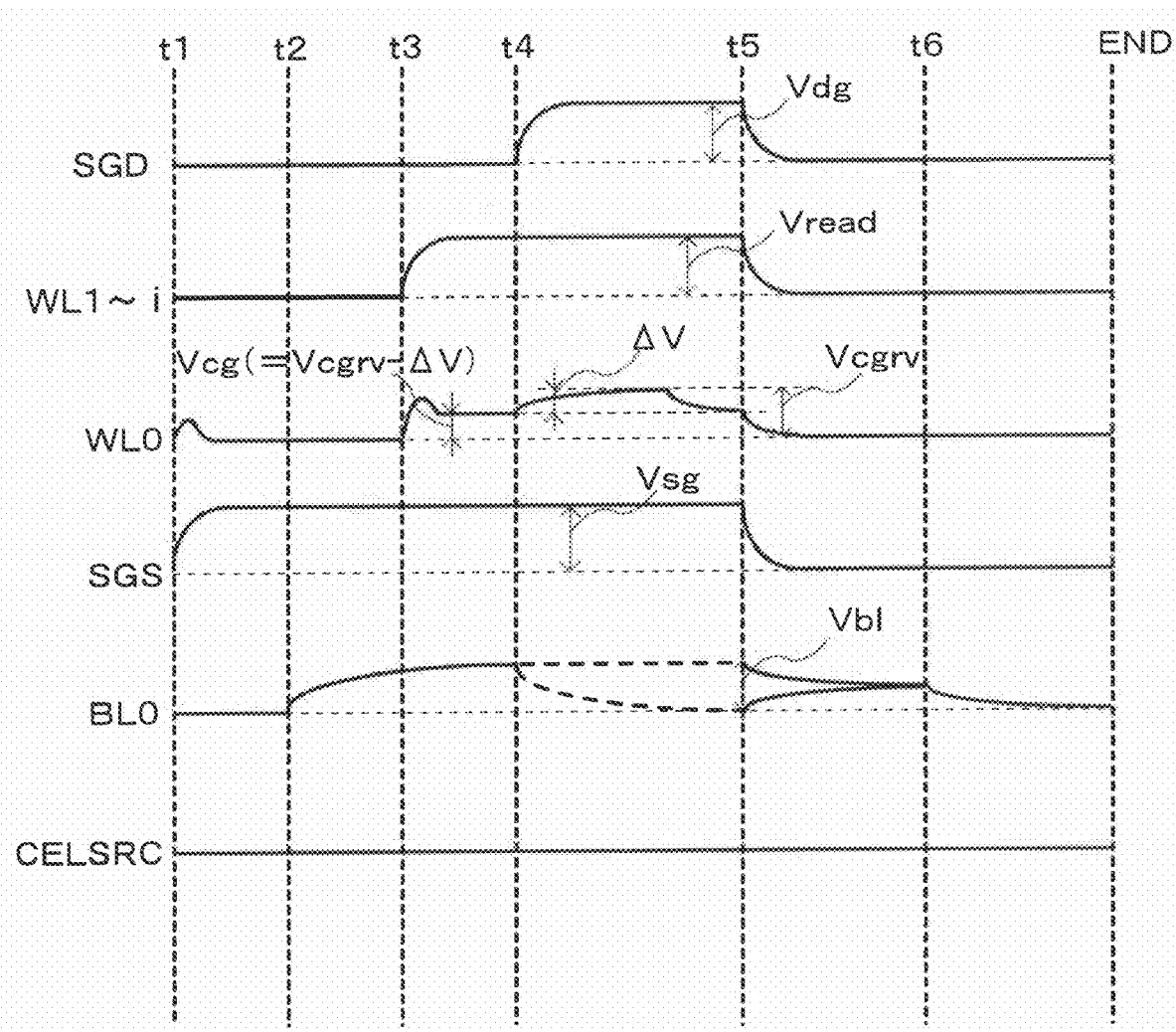
FIG. 14 is a first timing chart explaining a readout operation of the nonvolatile semiconductor memory according to the second embodiment of the present invention.
Figure 15:
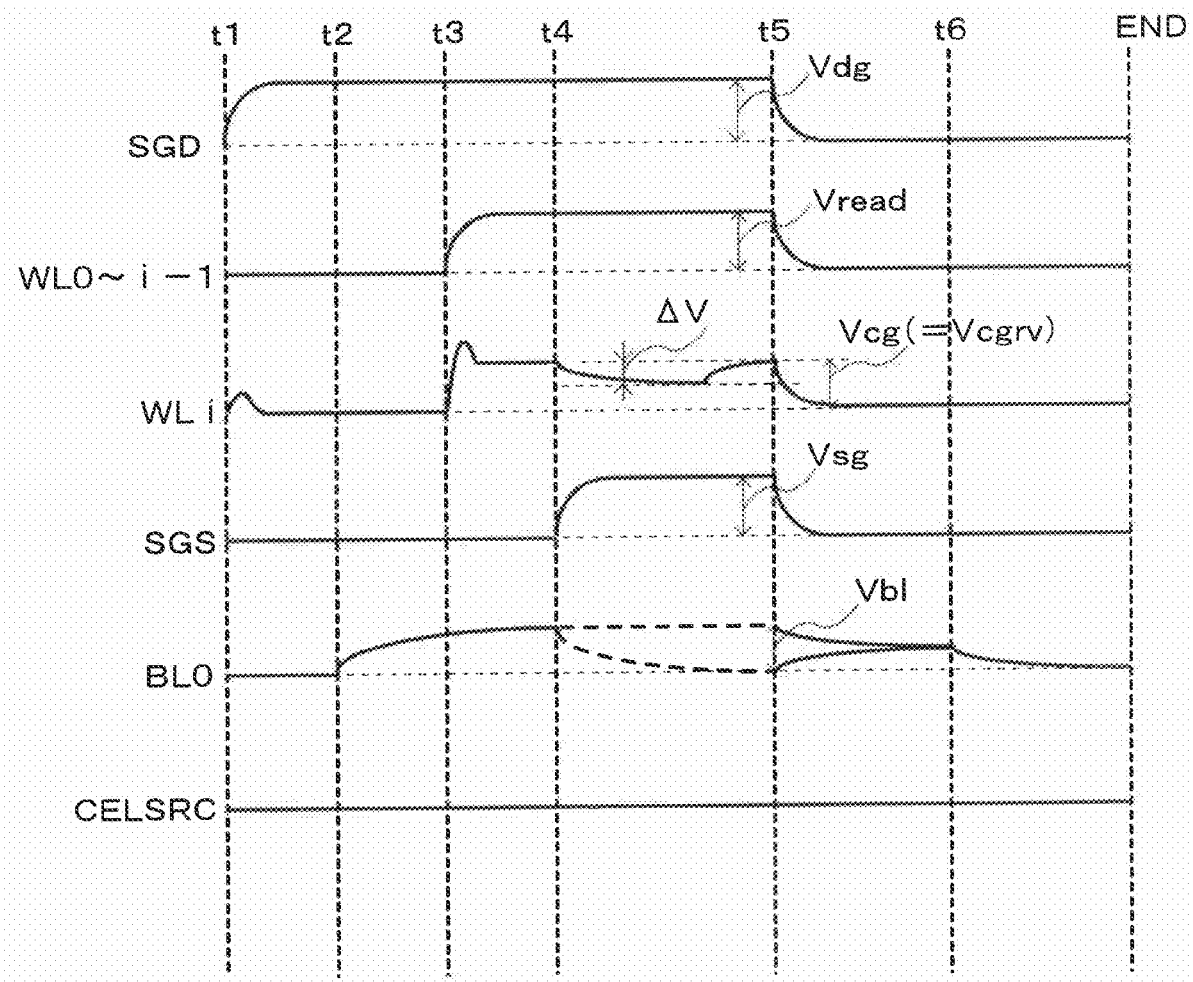
FIG. 15 is a second timing chart explaining the readout operation of the nonvolatile semiconductor memory device according to the second embodiment.

In the NAND type nonvolatile semiconductor memory 1 according to the second embodiment, voltage values of: the select voltage Vcg applied to the selected word line WL0 that is connected to the selected memory cell MC0 when the voltage of the source side selected gate line SGS that is connected to the source side selection transistor S1 shown in FIG. 14 is boosted in advance; and the select voltage Vcg applied to the selected word line WLi that is connected to the selected memory cell MCi when voltage of the drain side selected gate line SGD that is connected to the drain side selection transistor S2 shown in FIG. 15 is boosted in advance, are different.

Explaining to be concrete, when data stored in the selected memory cell MC0 adjacent to the source side selection transistor S1 is read out, as shown in FIG. 14, the voltage of the selected word line WL is stepped up at a time t3, the select voltage Vcg used for the voltage step-up is lower as well as the minute voltage ΔV as compared to the select voltage Vcgrv shown in FIG. 16. On the other hand, in the case data stored in the selected memory cell MCi adjacent to the drain side selection transistor S2 is read out, as shown in FIG. 15, the voltage of the selected word line WLi is boosted at a the time t3; this select voltage Vcg used in the boosting voltage is the same potential to the select voltage shown in FIG. 17 (Vcg=Vcgrv).

Figure 18:
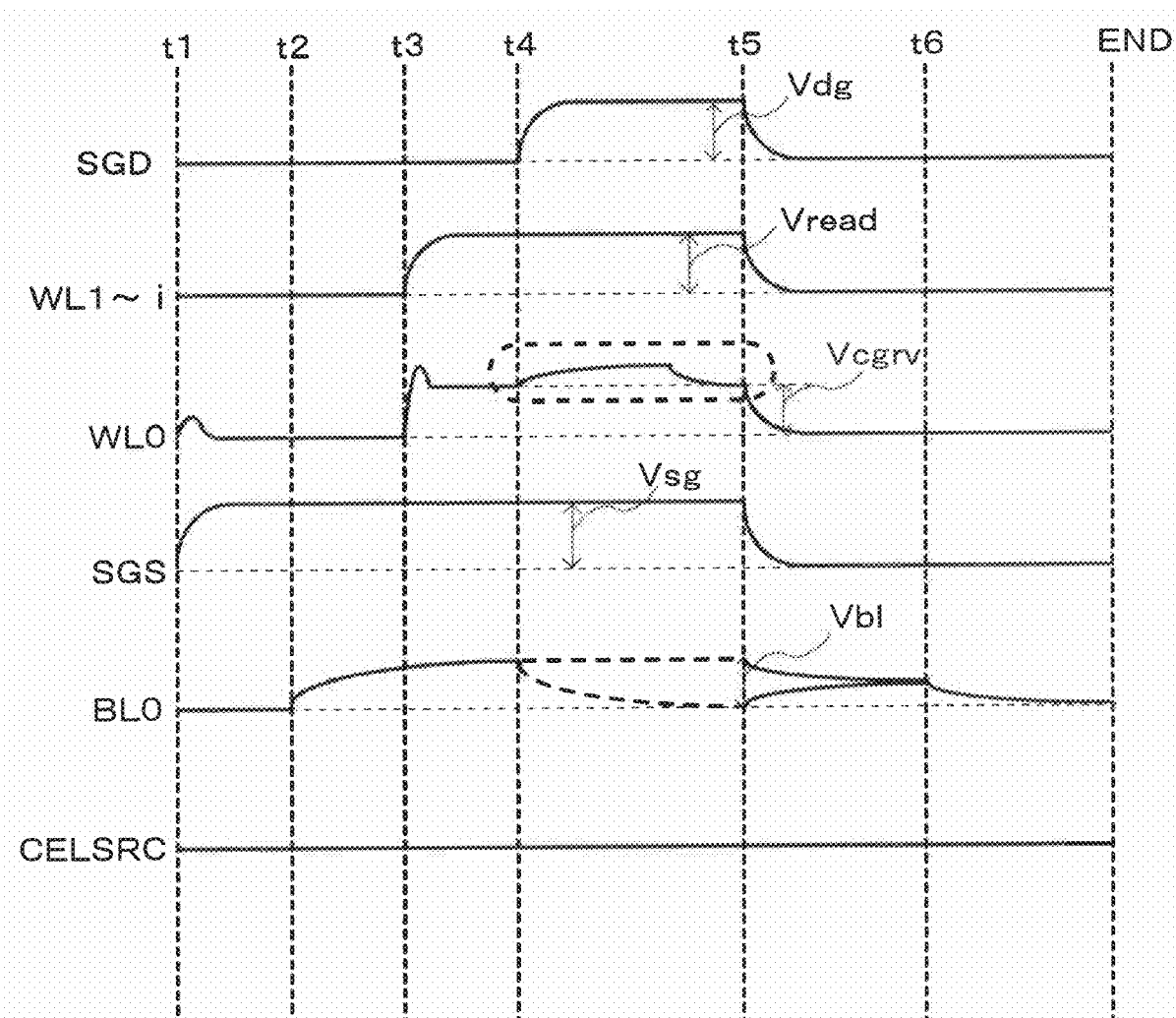
FIG. 18 is a fifth timing chart explaining the readout operation of the nonvolatile semiconductor memory according to the second embodiment.

The reason for changing the voltage value of the select voltage Vcg, especially the reason for setting the select voltage Vcg being low as well as the minute voltage in a readout operation of the data stored in the selected memory cell MC0 adjacent to the source side selection transistor S1, is because of reducing the coupling noise occurring among the channel region (a current path) of the selected memory cell unit MU0 and added to the selected word line WL0. Such coupling noise, as shown in FIG. 14, occurs in the voltage waveform of the selected word line WL0 when exceeding the time t4. Here, as shown in FIG. 16, if the select voltage Vcgrv is just applied to the selected word line WL0, the pre-charged voltage Vb1 that is pre-charged to the selected bit line BL0 at the time t2, is flown in the channel region of the selected memory cell unit MU0 by the on-operation of the drain side selection transistor S2, then the channel region is charged. Based on the coupling capacitive occurring between the channel region and the selected word line WL0, coupling noise is added to the select voltage Vcgrv of the selected word line WL0, and an overshoot occurs in the select voltage Vcgrv as shown in FIG. 18.

Especially in the program verify operation, because the threshold voltage of the memory cell MC seems to be low by the overshoot, distribution of the threshold voltage is spread to the higher direction. Thus, the select voltage Vcg may be set to be lower than the threshold voltage by setting the select voltage Vcg to be low as well as the minute voltage ΔV from the select voltage Vcgrv, even though the overshooting. As a consequence, it may be inhibited that the distribution of threshold be spread to the higher direction. This is effective to the NAND type nonvolatile semiconductor memory 1, in which the multiple value data may be stored showing in the above-described FIG. 12, where it is required to control the threshold voltage of the memory cell MC to be narrow.

The minute voltage ΔV is stable at all times. Further, the minute voltage ΔV may be variable. In the case the minute voltage ΔV is variable, the coupling noise is generated between channel region and selection memory cell MC, and then, selection memory cell MC adds the coupling noise, and for this coupling noise, selection voltage Vcg is put every data readout operation, it can be corrected optimum. Here, instead of every operation of data readout, the variable voltage of the minute voltage ΔV may be either every memory cell unit MU, or every arrangement position of the selected memory cell MC of the memory cell unit MU; and the variable unit of the minute voltage ΔV may be a unit in which these two or more than two are combined.

Albeit the value of minute voltage ΔV can be adjusted accordingly by a system configuration of the NAND type nonvolatile semiconductor memory 1, and is not limited to the values described below; the value should be more than Vcgrv, that is to be concrete, more than 0V and equal to or less than 2V. More preferably, the voltage of minute voltage ΔV be more than 0V and equal to or less than 1V.

Figure 19:
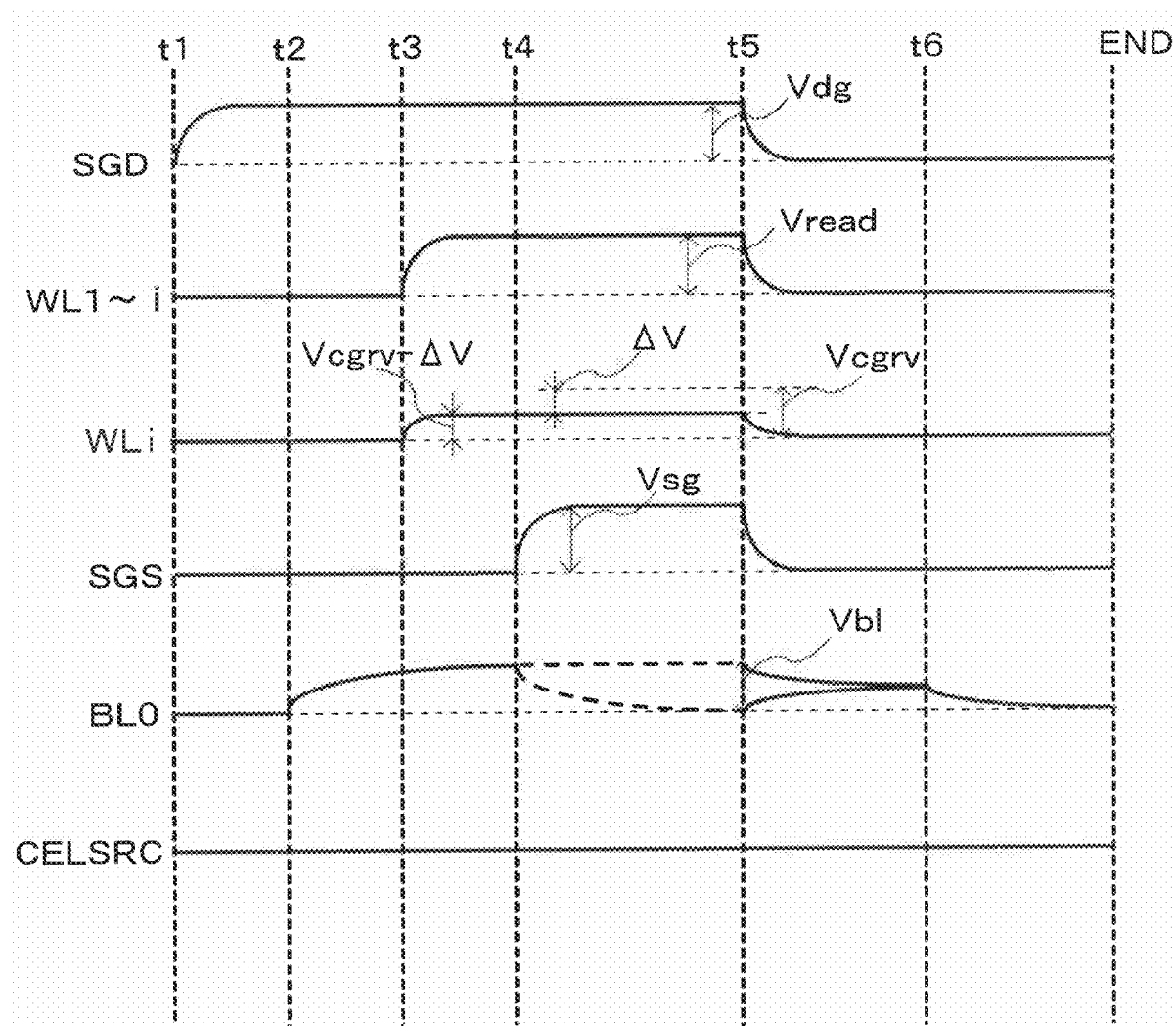
FIG. 19 is a sixth timing chart explaining the readout operation of the nonvolatile semiconductor memory according to the second embodiment.
Figure 20:
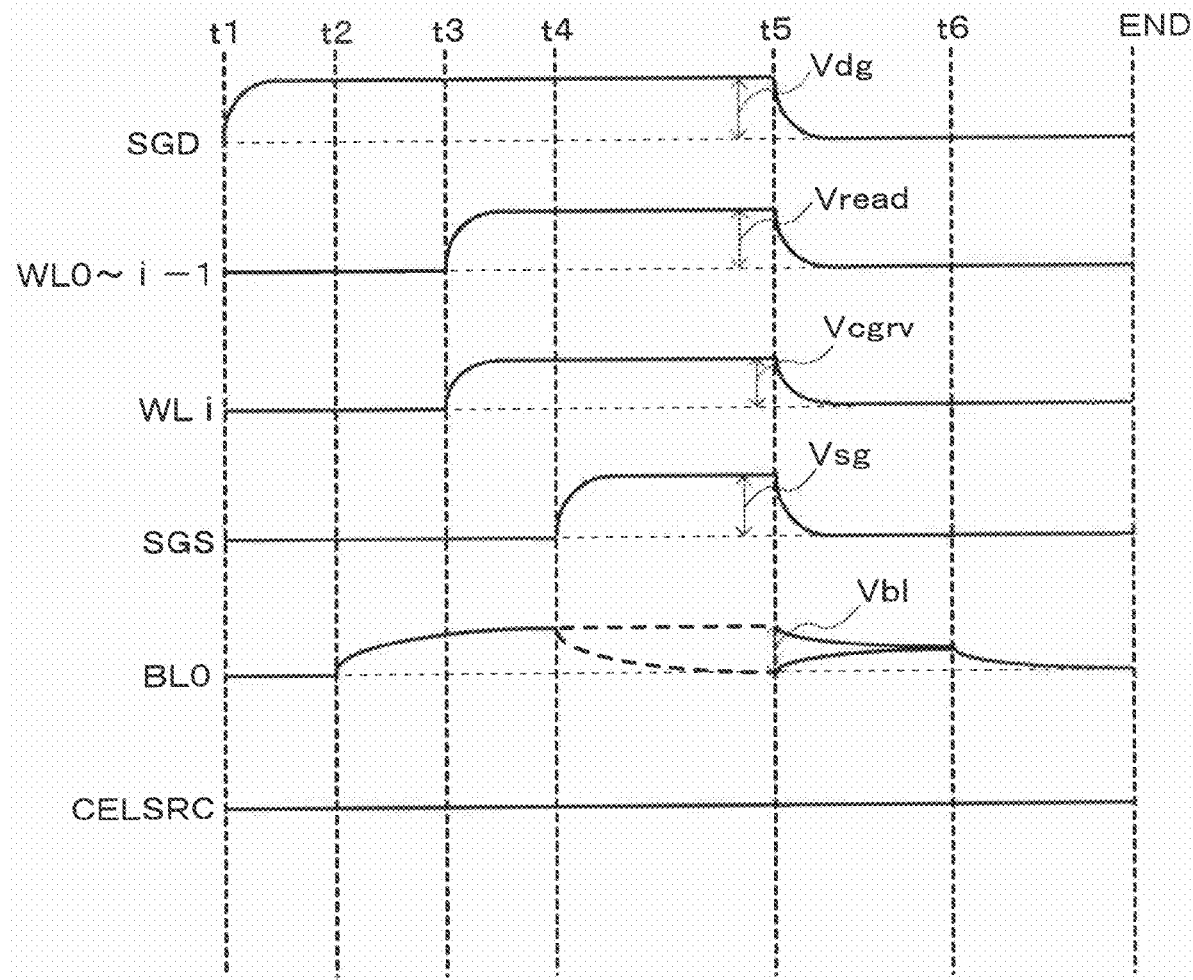
FIG. 20 is a seventh timing chart explaining the readout operation of the nonvolatile semiconductor memory according to the second embodiment.

On the other hand, when the voltage of the drain side selected gate line SGD that is connected to the drain side selection transistor S2, is stepped up to prior to the timing of the boosting voltage of the selected word line WLi that is connected to the selected memory cell MCi, the select voltage Vcgrv is used for the select voltage Vcg, because the coupling noise occurring among the space of drain region is functioned to an undershoot. Here, a timing chart is shown in FIG. 17, in which the coupling noise is reduced that occurs in the space among the drain side selected gate line SGD and added to the selected word line WLi. In FIG. 19, a timing chart is shown, in a case the select voltage Vcg, which is calculated by subtracting the minute voltage ΔV from the select voltage Vcgrv, is applied to the selected word line WLi. That is, when the voltage of the source side gate line SGS that is connected to the source side selection transistor S1 is stepped up in advance to the drain side gate line SGD, which is connected to the drain side selection transistor S2, the select voltage Vcg applied to the selected word line WL0 is set to be low. To be concrete, a low select voltage Vcg that is calculated by subtracting the minute voltage ΔV from the select voltage Vcgrv from the select voltage Vcgrv is used. In the other way of viewing, when the voltage of the drain side selected gate line SGD is stepped up in advance to the source side selected gate line SGS, the select voltage Vcg applied to the selected word line WLi is set to be high as compared to the select voltage Vcg applied to the selected word line WL0.

[Advantage of Data Readout Operation]

The NAND type nonvolatile semiconductor memory 1 according to the second embodiment, on the data readout operation, when the selected memory cell MC0 is adjacent to the source side selection transistor S1, a coupling noise may be reduced, which occurs among a space of the source side selected gate line SGS and is added to the selected word line WL0. In addition, when the selected memory cell MC0 is adjacent to the source side selection transistor S1, the coupling noise may be reduced, which occurs among a space of the selected memory cell unit MU0 and is added to the selected word line WL0.

In addition, when the selected memory cell MCi is adjacent to the drain side selection transistor S2, the coupling noise may be reduced, which occurs among a space of the drain side selected gate line SGD and is added to the selected word line WLi. Further, when the selected memory cell MCi is adjacent to the drain side selection transistor S2, no bad influence of coupling noise that occurs among a space of the channel region of the selected memory cell unit MUi and is added to the selected word line WLi is received. Therefore, an precise data readout operation may be realized, and thus a reliability on the operation of the NAND type nonvolatile semiconductor memory 1 may be improved.

In addition, in the NAND type nonvolatile semiconductor memory 1 according to the second embodiment, readout operation of data that is stored in the selected memory cell MC0 adjacent to the source side selection transistor S1, and readout operation of a data that is stored in the selected memory cell MCi adjacent to the drain side selection transistor S2, will be explained. If either of the memory cells, from the MC1 that is arranged to the source side selection transistor S1 via the memory cell MC0 to the memory cell MCi-1 that is arranged to the drain side selection transistor S2 via the memory cell MCi, is selected, the word lines WL1 to WLi-1 of the memory cells MC1 to MCi-1 are not adjacent to neither of the source side selected gate line SGS nor the drain side selection gate line SGD. Thus, the coupling noise added to the selected word lines WL1 to WLi-1 is small. Therefore, when either of the memory cells MC1 to MCi-1 is selected and the stored data is read out, either of the source side selection transistor S1 or the drain side selection transistor S2 may be made perform an on-operation prior to the counterparts.

However, the coupling noise added to the selected word line WL that occurs among a space of the channel region of the selected memory cell unit MU is required to be considered, and the coupling noise is required to be reduced. For instance, when the selected memory cell MC is near the source side selection transistor S1 as compared to the drain side selection transistor S2, the voltage of source side selection gate line SGS is boosted in advance. On the contrary, when the selected memory cell MC is near the drain side selection transistor S2 as compared to the source side selection transistor S1, the voltage of the drain side selection gate line SGD is boosted in advance.

To be concrete, when totally k memory cells MC is connected in series in one memory cell unit MU, if either of the memory cell from the first to the $n^{th}$ MC0 to MCn-1, which is nearer to the source side selection transistor S1 in the memory cell MC that is connected in series, is selected, the voltage of source side selection gate line SGS is boosted in advance, and the voltage of drain side selection gate line SGD is stepped up in advance. Further, if either of the memory cells Mcn to MCk-1, from the n+1$^{th}$ memory cell that is near the drain side selection transistor to the k$^{th}$ memory cell that is near the drain side selection transistor S2 is selected among the memory cells MC that is connected in series, voltage of the drain side selection gate line SGD is boosted in advance and the voltage of the source side selection gate line SGS is boosted afterwards. Here, "k" is an integer equal to or more than 2, and "k-1" is equivalent to "i" that is marked in the last step of the memory cells MC; "n" is an integer equal to or more than 0 that is smaller than "k."

In addition, in the NAND type nonvolatile semiconductor memory 1 according to the second embodiment, as the sectional structure is shown in the above described FIG. 1, a source side shunt wiring 131SS is arranged on the memory cells MC0 to MCn−1 of the memory cell unit MU, and the drain side shunt wiring 131DS is arranged on the memory cells MCn to MCk−1 (MCn to MCi). That is, if either of the memory cells MC0 to MCn−1 is selected, coupling noise, which occurs among a space of the source side shunt wiring 131SS of the selected word line to either of the word lines WL0 to WLn−1, is added; therefore, it is effective that the voltage of the source side gate line SGS is boosted in advance on the data readout operation. As well, if either of the memory cells MCn to MCi is selected, coupling noise, which occurs among a space of the drain side shunt wiring 131DS, occurs in either of the selected word lines WLn to WLi; therefore, it is effective that the voltage of drain side gate line SGD is boosted in advance on the data readout operation.

[Configuration of Select Voltage Generation Circuit]

In the NAND type nonvolatile semiconductor memory 1 according to the second embodiment, the select voltage generation circuit 62 of the control signal generation circuit shown in FIG. 3, generates, on the data readout operation, the select voltage Vcg (=Vcgrv−ΔV) applied to either of the selected word line WL0 to WLn−1, or the select voltage Vcg (=Vcgrv) applied to either of the selected word lines WLn to WLi, respectively. The select voltage generation circuit 62 is at least provided with a voltage value selection circuit 621 and a voltage output circuit 622.

The voltage selection circuit 621 outputs a voltage value decision signal FSVCG that determines a voltage value applied to the selected word line WL to the voltage output circuit 622, based on an input of a ROMFUS signal setting value signal. In the ROMFUSE setting value signal, information is included, whether the selected memory cell MC (selected word line WL) is at the source side selection transistor S1 or at the drain side selection transistor S2.

The voltage output circuit 622 generates the select voltage Vcg applied to the selected word line WL (=Vcgrv−ΔV) or a select voltage Vcg (=Vcgrv), based on the input of the voltage value decision signal FSVCG, then outputs the select voltage Vcg to the select voltage transfer circuit 63. The voltage output circuit 622 is basically configured by a resistance dividing circuit so that a variety of select voltage Vcg may be generated by changing a divide position accordingly based on the voltage value decision signal FSVCG.

[Application to Memory Card]

In the NAND type nonvolatile semiconductor memory 1 according to the second embodiment, a memory card 200 showing in the above described FIG. 13 may be constructed. The memory card 200 basically has the same configuration with the memory card 200 shown in the FIG. 13, only substituting the NAND type nonvolatile semiconductor memory 1.

In the data readout operation or data program operation of the NAND type nonvolatile semiconductor memory 1 according to the second embodiment configured in this manner, the respective order of operation, of the source side selection transistor S1 and the drain side selection transistor S2, according to the arranged position of the selected memory cell MC of the memory cell unit MU, has been changed. Therefore, coupling noise that occurs among a space of the source side selection gate line SGS or that of the drain side selection gate line SGD and is added to the selected word line WL may be reduced. In addition, the coupling noise that occurs among a space of the channel region (current paths) of the memory cell unit MU and is added to the selected word line WL may be reduced. As a consequence, an error on operation may be prevented, and thus a reliability of the NAND type nonvolatile semiconductor memory 1 on operation may be improved.

Further, because the reliability of the NAND type nonvolatile semiconductor memory 1 on operation may be improved, the reliability of the memory card 200, on which the NAND type nonvolatile semiconductor memory 1 is installed, may be improved.

The Other Embodiments

The present invention is not limited to the NAND type nonvolatile semiconductor memory 1 according to each of the first and second embodiments described above. For instance, the present invention may be considered as a NAND type nonvolatile semiconductor memory that combines the NAND type nonvolatile semiconductor memory 1 according to the first embodiment with the NAND type nonvolatile semiconductor memory 1 according to the second embodiment. That is, in the NAND type nonvolatile semiconductor memory, an operation order of the source side selection transistor S1 and the drain side selection transistor S2 may be substituted, as well as shifting the timing for the boosting voltage of the selected word line WL and that for the boosting voltage of the non-selected word line WL.

What is claimed is:

1. A nonvolatile semiconductor memory comprising:
 a memory cell unit including a plurality of electrically connected memory cells having an electric charge accumulation layer and a control electrode stacked thereon; and a source side selection transistor electrically connected to said memory cell of one end of said plurality of memory cells; and a drain side selection transistor electrically connected to the other end of said plurality of memory cells;
 a plurality of word lines each of which is electrically connected to a control electrode of said plurality of memory cells;
 a source line which is electrically connected to said source side selection transistor;
 a bit line which is electrically connected to said drain side selection transistor;
 a gate line control circuit, in which on a data readout operation, said drain side selection transistor is operated after the operation of said source side selection transistor when a selected memory cell is adjacent to said source side selection transistor, and said source side selection transistor is operated after the operation of said drain side selection transistor when said selected memory cell is adjacent to said drain side selection transistor; and
 a control signal generation circuit which on a data readout operation, lowers the select voltage applied to a selected word line connected to said selected memory cell adjacent to said source side selection transistor compared to the select voltage applied to a selected word line connected to said selected memory cell adjacent to said drain side selection transistor.

2. A nonvolatile semiconductor memory comprising:
 a memory cell unit including a plurality of electrically connected memory cells having an electric charge accumulation layer and a control electrode stacked thereon; a source side selection transistor electrically connected to said memory cell of one end of said plurality of memory cells; and a drain side selection transistor electrically connected to the other end of said plurality of memory cells;

a plurality of word lines each of which is electrically connected to a control electrode of said plurality of memory cells;

a source line which is electrically connected to said source side selection transistor;

a bit line which is electrically connected to said drain side selection transistor;

a gate line control circuit, in which on a data readout operation, said drain side selection transistor is operated after the operation of said source side selection transistor when a selected memory cell is adjacent to said source side selection transistor, and said source side selection transistor is operated after the operation of said drain side selection transistor when said selected memory cell is adjacent to said drain side selection transistor; and a control signal generation circuit in which on a data readout operation, the select voltage applied to said selected word line connected to said selected memory cell adjacent to said source side selection transistor at the time when said source side selection transistor begins to operate and the select voltage applied to the selected word line connected to said selected memory cell adjacent to said drain side selection transistor at the time when said drain side selection transistor begins to operate are different.

3. The nonvolatile semiconductor memory in claim 1, wherein said gate line control circuit operates said drain side selection transistor after said source side selection transistor when an n-th memory cell is selected out of a total of k memory cells included in said memory cell unit, "k" being an integer which is equal to or larger than "2", and "n" being an integer smaller than "k" but larger than "0"; and said gate line control circuit operates said source side selection transistor after said drain side selection transistor when one of (n+1)-th to k-th memory cell is selected.

4. A memory card comprising:
   a nonvolatile semiconductor memory defined in claim 1;
   a controller which controls an operation of said nonvolatile semiconductor memory; and
   a pad section connected to said nonvolatile semiconductor memory via said controller and which performs an input of control signal, an input of power and an input/output of data.

5. The nonvolatile semiconductor memory in claim 2, wherein the select voltage applied to said selected word line connected to said selected memory cell adjacent to said source side selection transistor at the time when said source side selection transistor begins to operate is lower than said select voltage applied to said selected word line connected to said selected memory cell adjacent to said drain side selection transistor at the time when said drain side selection transistor begins to operate.

* * * * *